(12) United States Patent
Rybicki et al.

(10) Patent No.: US 6,212,230 B1
(45) Date of Patent: Apr. 3, 2001

(54) METHOD AND APPARATUS FOR PULSE POSITION MODULATION

(75) Inventors: Mathew A. Rybicki; H. Spence Jackson, both of Austin; Timothy W. Markison, McKinney; Gregg S. Kodra; Michael A. Margules, both of Austin, all of TX (US)

(73) Assignee: Sigmatel, Inc., Austin, TX (US)

( * ) Notice: Subject to any disclaimer, the term of this patent is extended or adjusted under 35 U.S.C. 154(b) by 0 days.

(21) Appl. No.: 09/071,239

(22) Filed: Apr. 4, 1998

(51) Int. Cl.$^7$ .............................. H03M 5/08; H03K 7/04; H03K 7/08
(52) U.S. Cl. .......................... 375/239; 341/53; 332/112
(58) Field of Search ...................................... 375/239, 238, 375/284, 353; 332/108, 109, 112, 115; 370/205, 212, 213, 533; 327/172, 178, 306; 341/50, 52, 53, 173, 182

(56) References Cited

U.S. PATENT DOCUMENTS

| | | | |
|---|---|---|---|
| 5,151,698 | * 9/1992 | Pophillat | 341/52 |
| 5,214,526 | * 5/1993 | Tonomura | 359/184 |
| 5,400,022 | * 3/1995 | Montagne | 341/53 |
| 5,684,871 | * 11/1997 | Devon et al. | 375/239 |

* cited by examiner

*Primary Examiner*—Stephen Chin
*Assistant Examiner*—Betsy L. Deppe
(74) *Attorney, Agent, or Firm*—Timothy W. Markison

(57) ABSTRACT

A method and apparatus for pulse position modulation begins when a digital data stream is received. The encoding process continues by obtaining a set of bits from the digital data stream and modulating the set of bits into a pulse having a pulse width. Next, a transition edge of the pulse is positioned at one of a plurality of time intervals within a time chip based on the set of bits, wherein the pulse width is greater than each of the plurality of time intervals.

18 Claims, 30 Drawing Sheets

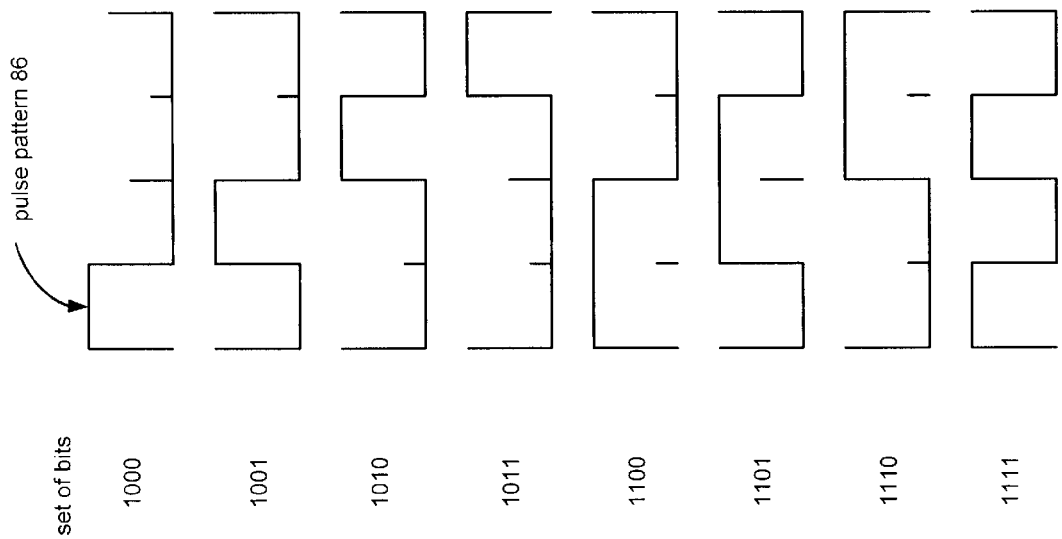
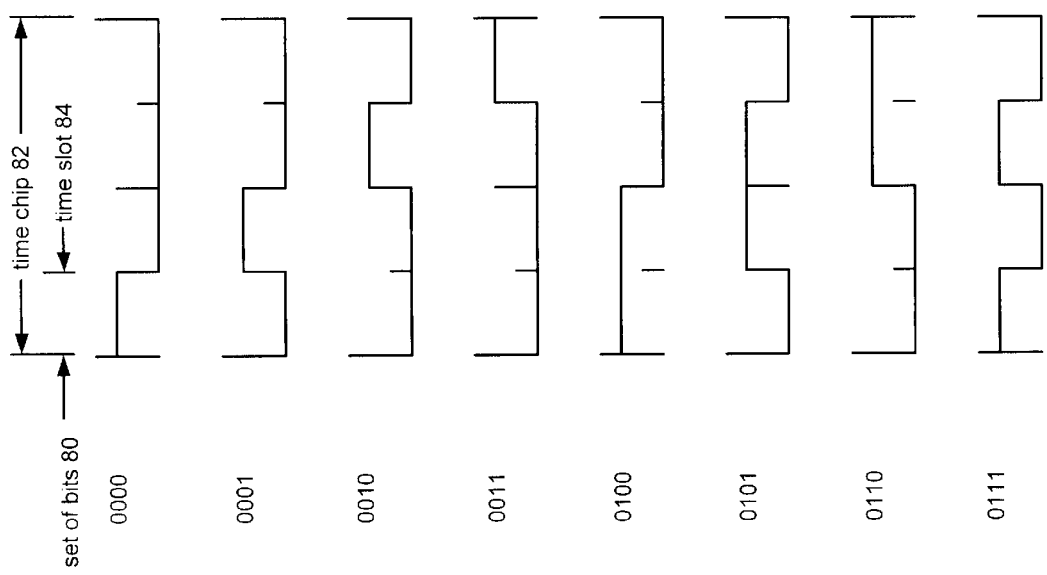
Figure 4

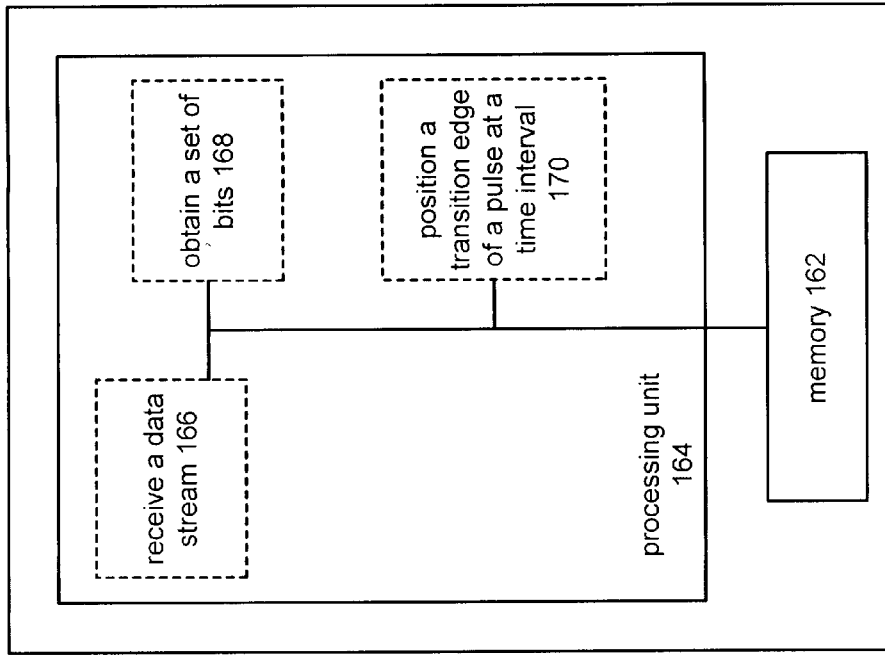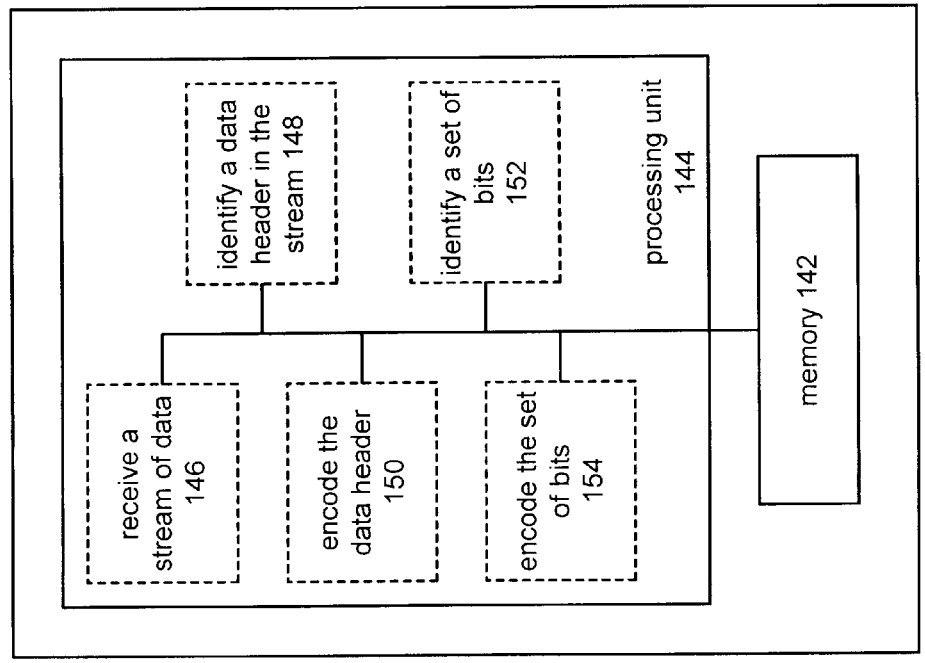
Figure 10 data receiver 14 demodulator 12 demodulator 12

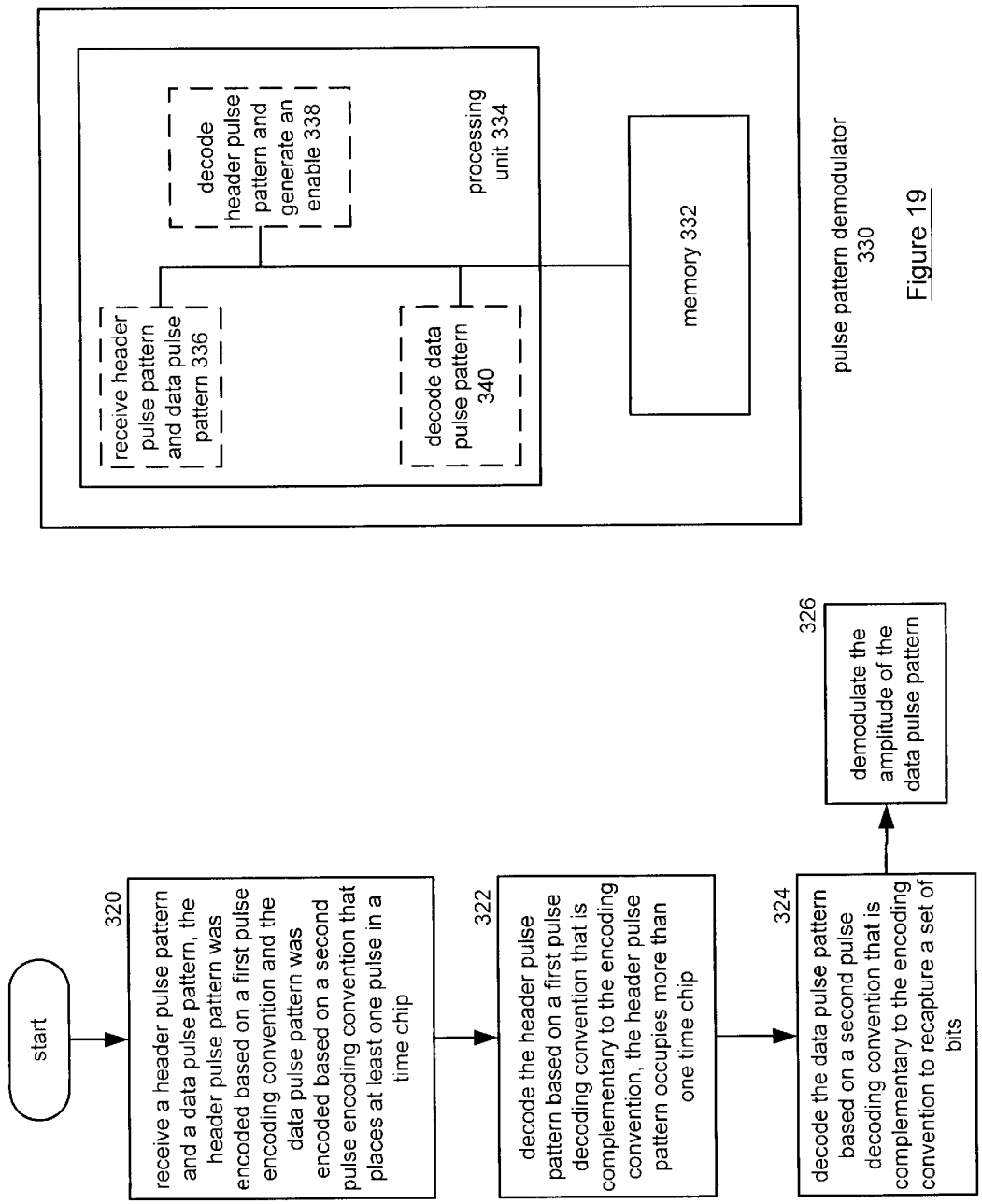

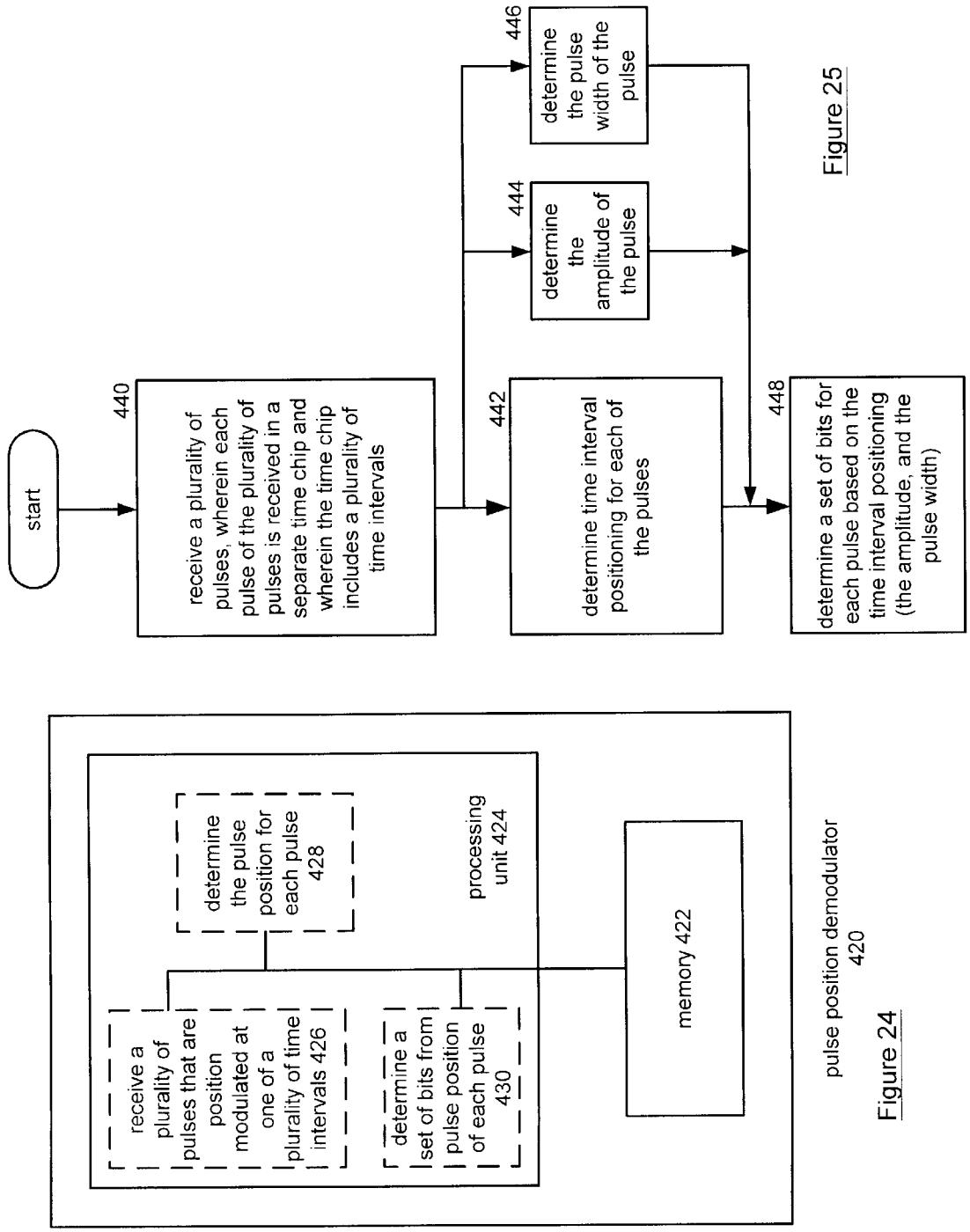

METHOD AND APPARATUS FOR PULSE POSITION MODULATION

TECHNICAL FIELD OF THE INVENTION

The present invention relates generally to transmission of data and more particularly to infrared transmission of data.

BACKGROUND OF THE INVENTION

The use of infrared circuitry to transmit data from one device to another has been used for several years. For example, a television remote control device communicates television commands to a television set via an infrared communication path. The remote control includes a user-input mechanism (e.g., a keypad) which receives input requests from the user. The circuitry of the remote control encodes the command and transmits, via an infrared communication path, the encoded command to the television set. The television set decodes the encoded command to recapture the input command, which the television processes accordingly.

The television remote control, and other similar devices, use an encoding scheme based on a relatively low data transmission rate (i.e., less than two hundred kilobits per second). One such encoding scheme is a modulation technique called amplitude shift keying (ASK). The ASK modulation technique utilizes a presence/absence of a high frequency square wave (e.g., having a frequency of 500 KHz to 2 MHz) at a given rate (e.g., five to ten microseconds) to encode the data. The encoding scheme represents a logic 1 when the high frequency signal is present in a given time interval and a logic 0 when the high frequency signal is not present in the given time interval. As such, the remote control digitally encodes the command by controlling the presence and absence of the high frequency signal within given time intervals. Correspondingly, the television set decodes the ASK modulated signal by detecting the presence and absence of the high frequency signal and assigns the corresponding logic value.

For high speed infrared data transmissions, such as would be used in many computer applications, a pulse position modulation (PPM) technique is used. Such a technique is proposed in an Infrared Data Association Serial Infrared Physical Layer Length specification (IrDA specification). In general, the IrDA specification defines a four-PPM, 4 Mbps (Megabits per second) infrared modulation technique. The four-PPM modulation technique is based on 500 nanoseconds time chips that are divided into four 125 nSec time slots. Encoding of two bits of data is done by placing a pulse having a 125 nSec pulse width in one of the four time slots. When the pulse is placed in the first time slot, it represents a digital value of 00; when it is placed in the second time slot, it represents a digital value of 01; when it is placed in the third time slot, it represents a digital value of 10, and when it is placed in the fourth time slot, it represents a digital value of 11. Thus, 2 bits of data are transmitted every 500 nSec, or 4 bits per 1 microsecond, which provides the 4 Mbps data rate.

The IrDA standard further requires that a preamble and start flag be used to indicate the start of a data transmission and a stop flag to indicate when data transmission has ended. In addition, the preamble and/or start flag are transmitted periodically to provide synchronization information during the data transmission, The preamble, start flag, and stop flag are encoded and decoded based on a first pulse encoding convention. In particular, the first encoding convention has the preamble, start and stop flags span several time chips, where some time chips include zero pulses, other include one pulse, and still others include 3 pulses. Such an encoding convention is different that the data encoding convention of 4 PPM, which requires a single pulse to be contained with each time chip.

At the 4 Mbps rate, commercial grade light emitting diodes (LED) and light receiving diodes (LRD) are approaching their maximum operating speeds (e.g., commercial grade LEDs and LRDs cost 25 cents or less per part). Typically, the minimum pulse width that a commercial grade light emitting diode can reliably produce given typical bias conditions is approximately 80 nSec. Similarly, the minimum pulse width that a light receiving diode can reliably detect is 80 nSec. In IrDA standard compliant applications, the pulse width of a pulse can vary from 85 nSec to 165 nSec, thus the minimum acceptable pulse width, i.e., pulse duration, is very near the capacity of the LEDs and LRDs.

While the IrDA standard defines a 4 PPM encoding and decoding concept that essentially maximizes the transmission rate of commercial grade LEDs and LRDs, there are many applications that require a data transmission rate greater than the 4 megabits per second. One solution to increasing the data rate is to use higher grade LEDs, and LRDs, but the cost per part is in the range of 5 U.S. dollars per part. Such a cost makes this an impractical solution for commercial applications. Another solution would be to use radio frequency (RF) modulation techniques, however, RF modulators and demodulators are considerably more complex and costly circuits than the 4 PPM encoders and decoders.

Therefore, a need exists for a method and apparatus that achieves higher data transmission rates than the 4 Mbps of IrDA standard, but utilizes commercial grade LEDs and LRDs. In addition, the new method and apparatus should be backward compatible with the components fabricated in compliance with the 4 Mbps IrDA standard.

BRIEF DESCRIPTION OF THE DRAWINGS

FIG. 4 illustrates a graphical representation of a pulse pattern modulation technique in accordance with the present invention;

FIG. 10 illustrates a schematic block diagram of a pulse pattern modulator and pulse position modulator in accordance with the present invention;

FIG. 18 illustrates a logic diagram of a method for demodulating pulse pattern encoded signals in accordance with the present invention;

FIG. 19 illustrates a schematic block diagram of a pulse pattern demodulator in accordance with the present invention;

FIG. 24 illustrates yet another schematic block diagram of a pulse position decoding in accordance with the present invention;

FIG. 25 illustrates a logic diagram of an alternate method for pulse position decoding in accordance with the present invention;

DETAILED DESCRIPTION OF A PREFERRED EMBODIMENT

Generally, the present invention provides a method and apparatus for pulse position modulation. The encoding process begins when a digital data stream is received. The encoding process continues by obtaining a set of bits from the digital data stream and modulating the set of bits into a pulse having a pulse width. Next, a transition edge of the pulse is positioned at one of a plurality of time intervals within a time chip based on the set of bits, wherein the pulse width is greater than each of the plurality of time intervals. With such a method and apparatus, data rates in excess of 8 Mbps are obtained using commercial LEDs and LRDs, thereby allowing higher data rate applications to be accommodated with minimal additional cost to the processing host (e.g., a computer, television, personal digital assistant, etc.). In addition, the present method and apparatus can be constructed to be backward compatible with 4 Mbps 4 PPM IrDA standard compliant products.

Figure 1:
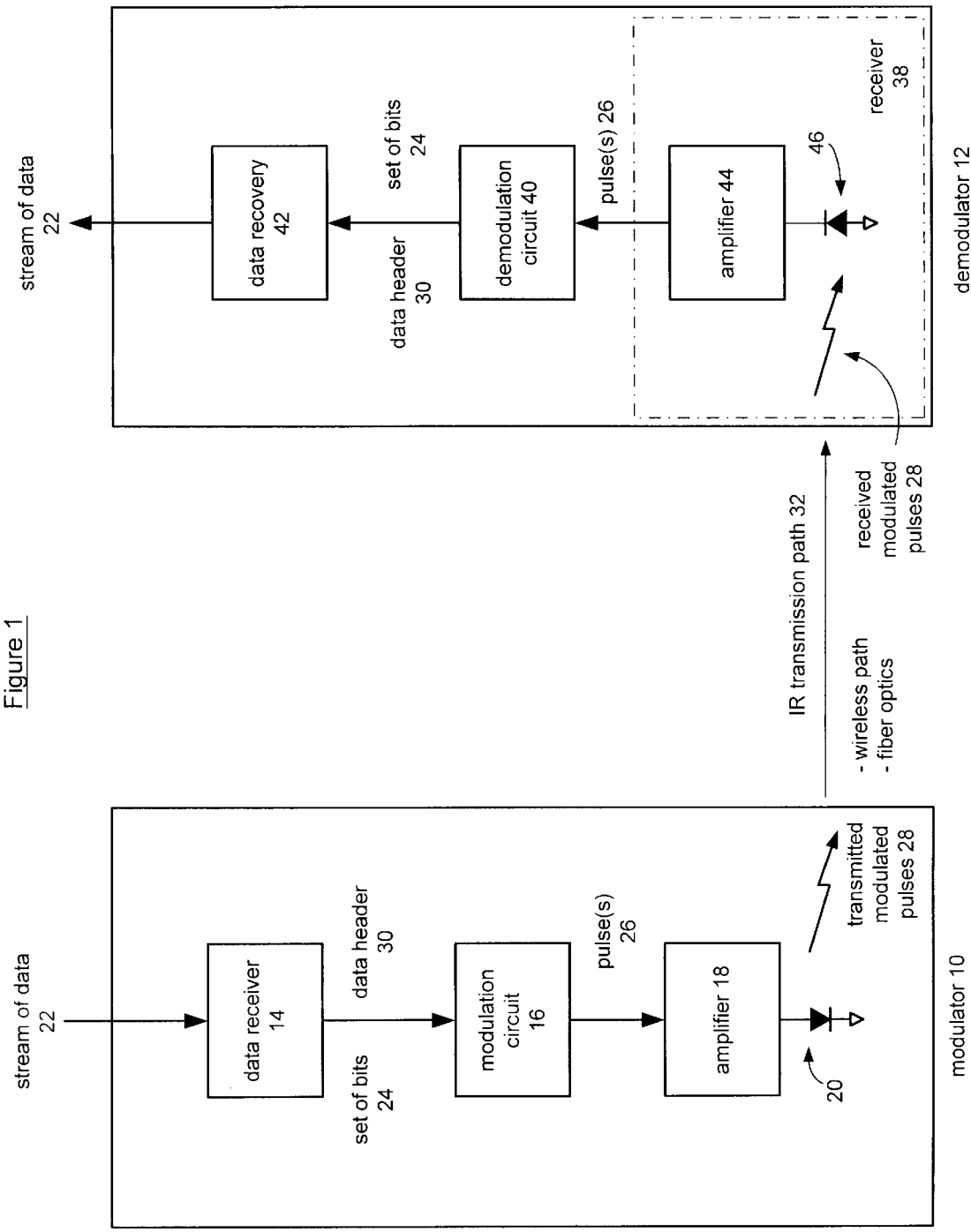
FIG. 1 illustrates a schematic block diagram of a modulator and demodulator in accordance with the present invention.

The present invention can be more fully described with reference to FIGS. 1 through 38. FIG. 1 illustrates a schematic block diagram of a modulator 10 and demodulator 12 that transceive information via an IR (infrared) transmission path 32. The modulator 10 may be incorporated in any type of device that transmits data, such as a remote control unit for a television, stereo, amplifier, computer, telephone, etc. The demodulator 12 may be incorporated in complimentary components of those embodying the modulator 10, such as a television set, a stereo, an amplifier, another computer, a telephone base, etc. Additionally, the modulator 10 and the demodulator 12 may both be incorporated in devices that transceive data, such as a computer, a telephone, a personal digital assistant, a facsimile machine, etc. For example, a laptop computer and a personal computer may each include a modulator 10 and demodulator 12 such that the computers may exchange data through a wireless IR connection.

The modulator 10 includes a data receiver 14, a modulation circuit 16, an amplifier 18, and a light emitting diode (LED) 20. The data receiver 14, which is discussed in greater detail with reference to FIG. 15, receives a stream of data 22 and extracts a set of bits 24 and a data header 30, therefrom. The modulation circuit 16 is operably coupled to receive the set of bits and the data header 30 and produces encoded pulses therefrom. The encoding of the pulses may be done by pulse positioning modulation, pulse pattern modulation, and/or pulse amplitude modulation. The encoded pulses 26 are then provided to the amplifier 18, which drives LED 20 to produce ed modulated pulses 28. The transmitted modulated pulses 28 are communicated to the demodulator 12 via the infra red transmission path 32, which may be a wireless path, (e.g., a communication path between a remote control device and a controlled device) or a fiber optics transmission path.

The demodulator 12 includes a receiver 38, a demodulation circuit 40, and a data recovery module 42. The receiver 38 includes a light receiving diode (LRD) 46 and an amplifier 44. The LRD 46 receives the transmitted modulated pulses 28 and provides them to the amplifier 44 to recover the encoded pulses 26. The demodulation circuit 40 receives the encoded pulses 26 and produces, therefrom, a set of bits 24 and a data header 30. The demodulation circuit 40 uses a complimentary decoding scheme to that used by the modulation circuit 16. As such, the demodulation circuit 40 utilizes pulse pattern demodulation, pulse positioning demodulation, and/or pulse amplitude demodulation, demodulates the pulses to recapture the data header 30 and the set of bits 24. The data recovery circuit 42 receives the data header 30 and set of bits 24 and recaptures therefrom, the stream of data 22. As one of average skill in the art will appreciate, the modulation and demodulation, or the encoding and decoding, of data in accordance with the present invention may also be applied to RF transmissions, such that the IR transmission path 32 is replaced with an RF transmission path.

Figure 2:
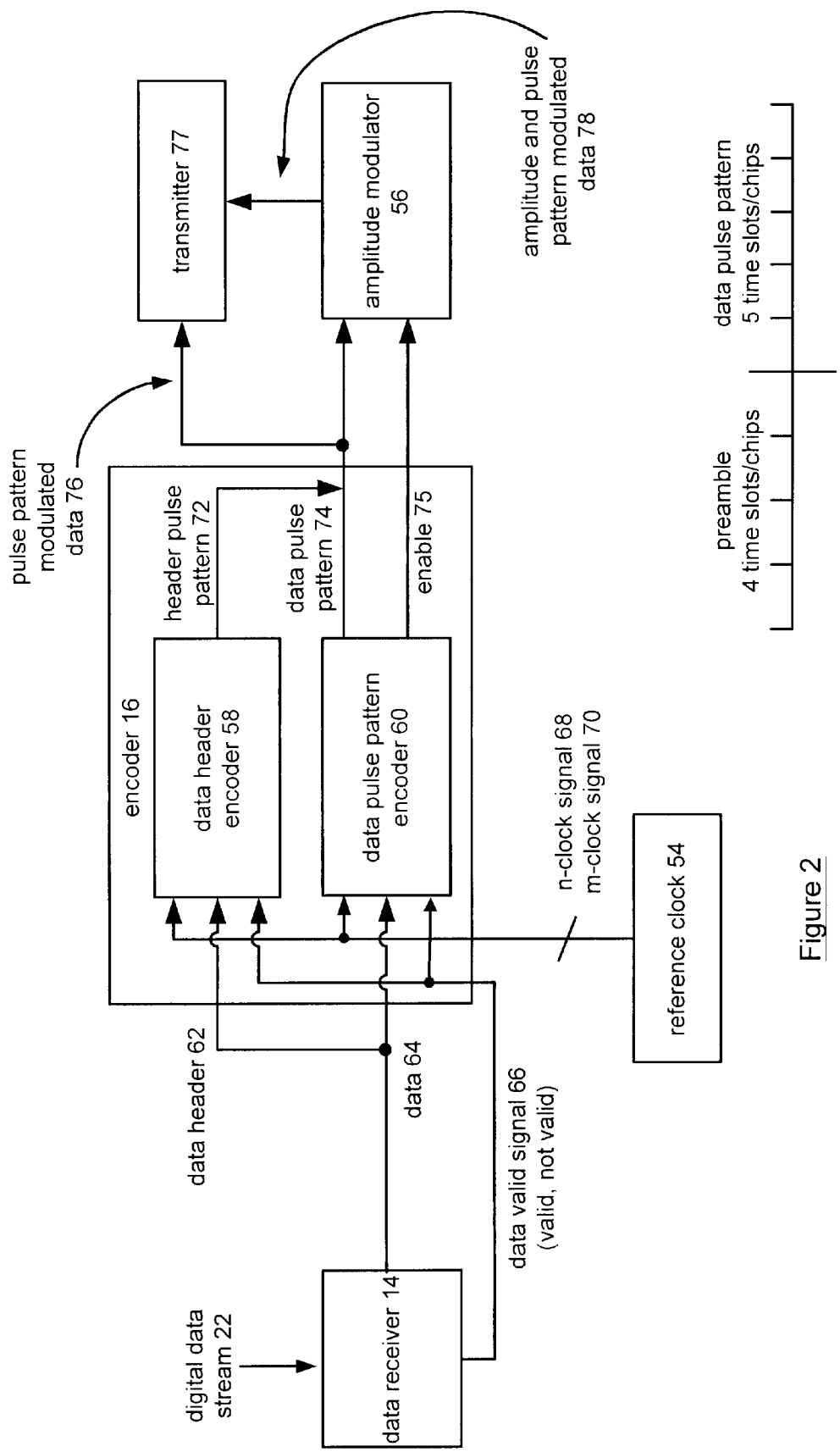
FIG. 2 illustrates a schematic block diagram of the modulator of FIG. 1 in greater detail.
Figure 3:
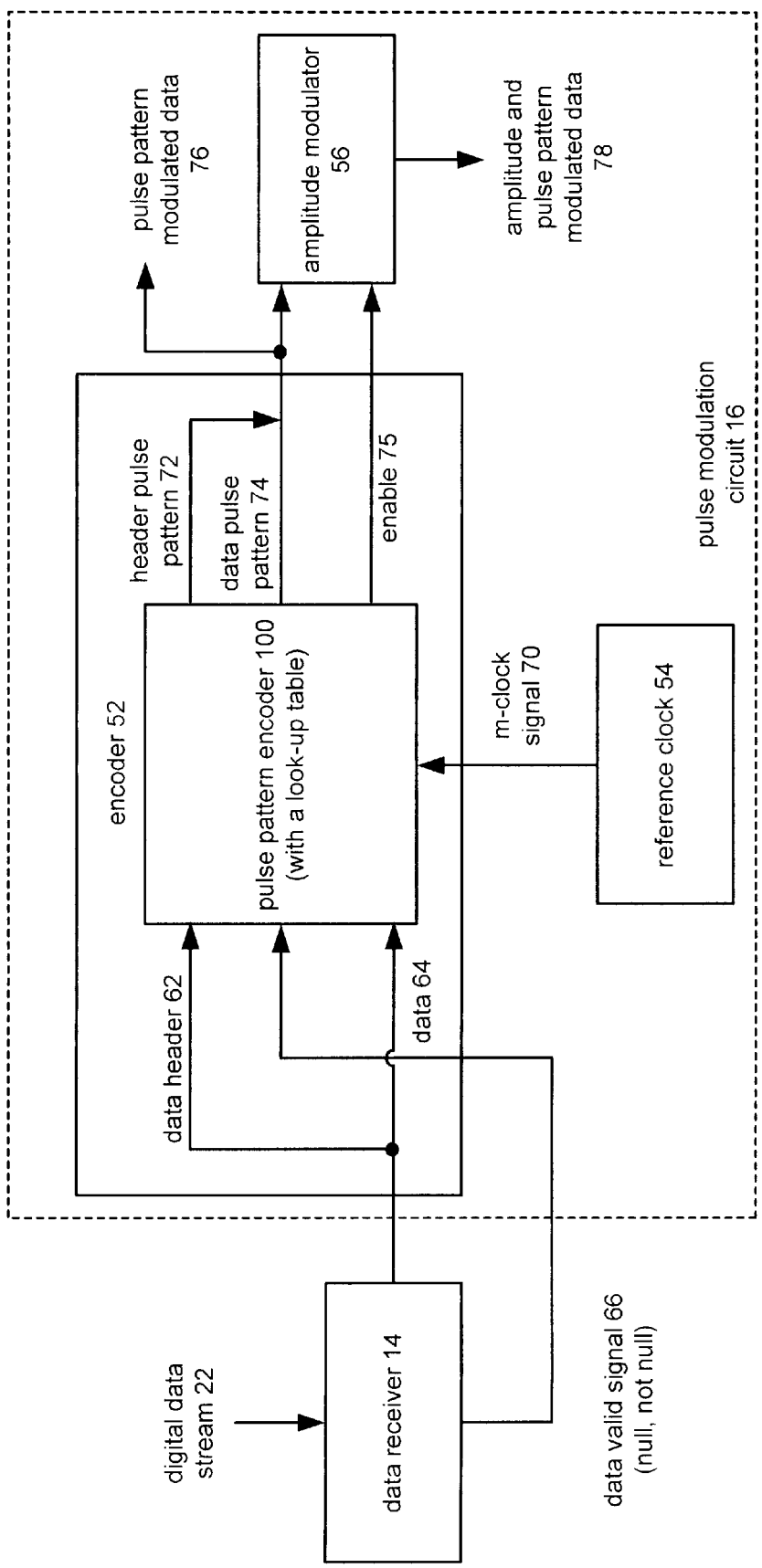
FIG. 3 illustrates a pulse pattern modulator in accordance with the present invention.

FIG. 2 illustrates a more detailed schematic block diagram of modulator 10 and an example of a first encoding convention for data header information and a second encoding convention for data. The modulator 10 includes the data receiver 14, the modulation, or encoder circuit 16, a reference clock 54, an amplitude modulator 56, and a transmitter 77. The transmitter 77 includes the amplifier 18 and light emitting diode 20 as shown in FIG. 1. Note that the modulators 10 shown in FIGS. 1, 2, and 3 are operable to provide higher data rates than the 4 Mbps, 4 PPM IrDA standard products and are backward compatible with such products. To achieve the higher data rates, the modulation circuit 10 may perform any one of the pulse pattern encoding techniques illustrated in FIGS. 4, 5, and 6 (discussed below) to encode the data 64 and may encode the data header 62 using any one of the methods illustrated in FIG. 7 (discussed below). Each of the data encoding techniques (i.e., FIGS. 4, 5, and 6) are based on time chips of 500 nSec in duration. Similarly, the data header encoding methods are also based on time chips of 500 nSec in duration. The higher data rates are obtained by manipulating the partitioning and grouping of the time chips along with pulse patterns. (This will be discussed in greater detail below.) As such, the LED 20 and LRD 46 may be commercial grade diodes similar to the ones used in IrDA compliant products. Since the LED 20 and LRD 46 do not need to be changed, the present invention may further include a switching mechanism that switches between the encoding and decoding of the present invention and the 4 Mbps, 4 PPM IrDA standard technique. Such a switching mechanism enables the present invention to be backward compatible with the IrDA compliant products. As one of average skill in the art will appreciate, the LED and LRD may be upgraded such that narrower pulses may be used, thereby further increasing the data rate over the rate increases obtained with the present invention.

In the modulator 10 of FIG. 2, the data receiver 14 is operably coupled to receive the digital data stream 22, to parse the data stream 22, and to provide a data header 62, data 64, and a data valid signal 66 to the encoder 16. The data receiver 14 parses the data stream 22 into the data 64 and the data header 62. In addition to parsing the data stream 22, the data receiver 14 generates the data valid signal 66 when it detects the data header 62. The details of the data receiver 14 will be discussed with reference to FIG. 15. For now, it is sufficient to know the basic data receiver 14 functions of parsing and data validity detection. As one of average skill in the art will appreciate, the data stream 22 may not include a data header 62, as such it only includes data 64. In this case, when the data receiver 14 detects the data 64, it would generate the data header and provide it to the encoder 16.

The encoder 16 includes a data header encoder 58 and a data pulse pattern encoder 60. The data header encoder 58 is operably coupled to receive the data header 62, the data valid signal 66, and n-clock signal 68. The data pulse pattern encoder 60 is operably coupled to receive the data 64, the data valid signal 66, and an m-clock signal 70. So coupled, the data header encoder 58 may encode the data header 62 in any number of ways (i.e., a plurality of first encoding conventions), such as those illustrated in FIG. 7.

Figure 5:
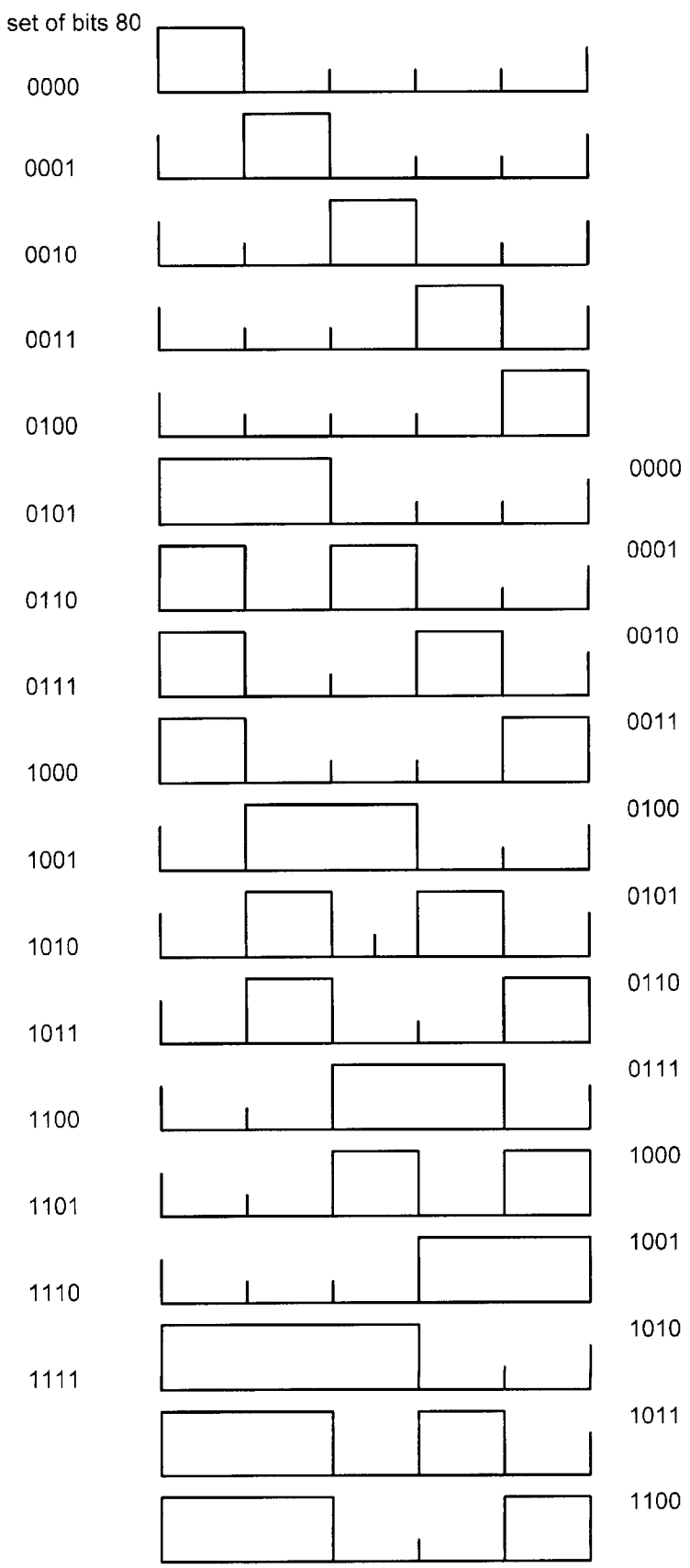
FIG. 5 illustrates another pulse pattern modulation technique in accordance with the present invention.

When the data valid signal indicates valid data, the data pulse encoder 60 encodes the data 64 using a second pulse encoding convention to produce data pulse pattern 74. The data pulse encoder 60, which is a logic circuit and/or table look-up, may use one of the second pulse encoding conventions (i.e., those illustrated in FIGS. 4 and 5) to produce the data pulse pattern. If the pulse encoding convention of FIG. 4 is used, the data pulse pattern is encoded to represent 3 bits of data per time chip, thereby increasing the data rate to 6 Mbps. If the pulse encoding convention of FIG. 5 is used, the data pulse pattern is encoded to represent 4 bits of data per time chip, thereby increasing the data rate to 8 Mbps. To further increase the data rate of either encoding convention, the data pulse pattern encoder 60 may enable the amplitude modulator 56 to amplitude modulate the pulse pattern to produce an amplitude and pulse pattern modulated signal 78. With the amplitude modulation enable, an extra 2 Mbps is obtained, thereby increasing the data rate of the encoding convention of FIG. 4 to 8 Mbps and data rate of the encoding convention of FIG. 5 to 10 Mbps. The amplitude modulator 56 will be discussed in greater detail with reference to FIGS. 26 through 30.

The transmitter 77, which includes the amplifier 18 and light emitting diode 20, is operably coupled to receive either the pulse pattern modulated data 76 or the amplitude and pulse pattern modulated data 78. In either case, the transmitter 77 transmits the appropriate data 76 or 78 to the demodulator 12 via the IR transmission path 32.

FIG. 2 further illustrates an example of the data header encoding convention and the data encoding convention, where the data header is to be encoded based on 4 time slots per time chip and the data is to be encoded based on 5 time slots per time chip. When the time slots per time chip differs between the data header 62 and the data 64, the reference clock circuit 54 generates two clock signals: n-clock signal 68 and m-clock signal 70. In this example, the n-clock signal 68 corresponds to the clock rate needed to encode the data header 62 and the m-clock signal 70 corresponds to the clock rate needed to encode the data 64. For example, if the time chip is 500 nSec, the n-clock signal 68 will be 8 MHz and the m-clock signal 70 will be 10 MHz. As one of average skill in the art will appreciate, when the time slots per time chip are the same for the data header 62 and the data 64, the clock circuit 54 would only need to produce one clock signal that is dependent on the number of time slots per time chip (e.g., 8 MHz clock signal for 4 time slots per time chip, or 10 MHz clock signal for 5 time slots per time chip).

FIG. 3 illustrates a schematic block diagram of an alternate pulse pattern modulator 10 that includes the data receiver 14 and the pulse modulation circuit 16. The pulse modulation circuit 16 includes an encoder 52, the reference clock 54, and an amplitude modulator 56. The encoder 52 includes a pulse pattern encoder 100 that, in turn includes a look up table. The pulse pattern encoder 100 is operably coupled to receive the data header 62, the data 64, and the data valid signal 66. When the data valid signal 66 indicates that the data 64 is valid, the pulse pattern encoder 100 encodes the data header based on a particular pattern stored in the look up table to produce a header pulse pattern 72. Similarly, the pulse pattern encoder 100 utilizes the data 64 to address the look-up table to produce the data pulse pattern 74. The look up table includes the pulse patterns illustrated in FIGS. 4, 5, and/or 6, or other pulse patterns that are capable of representing the data 64.

Figure 6:
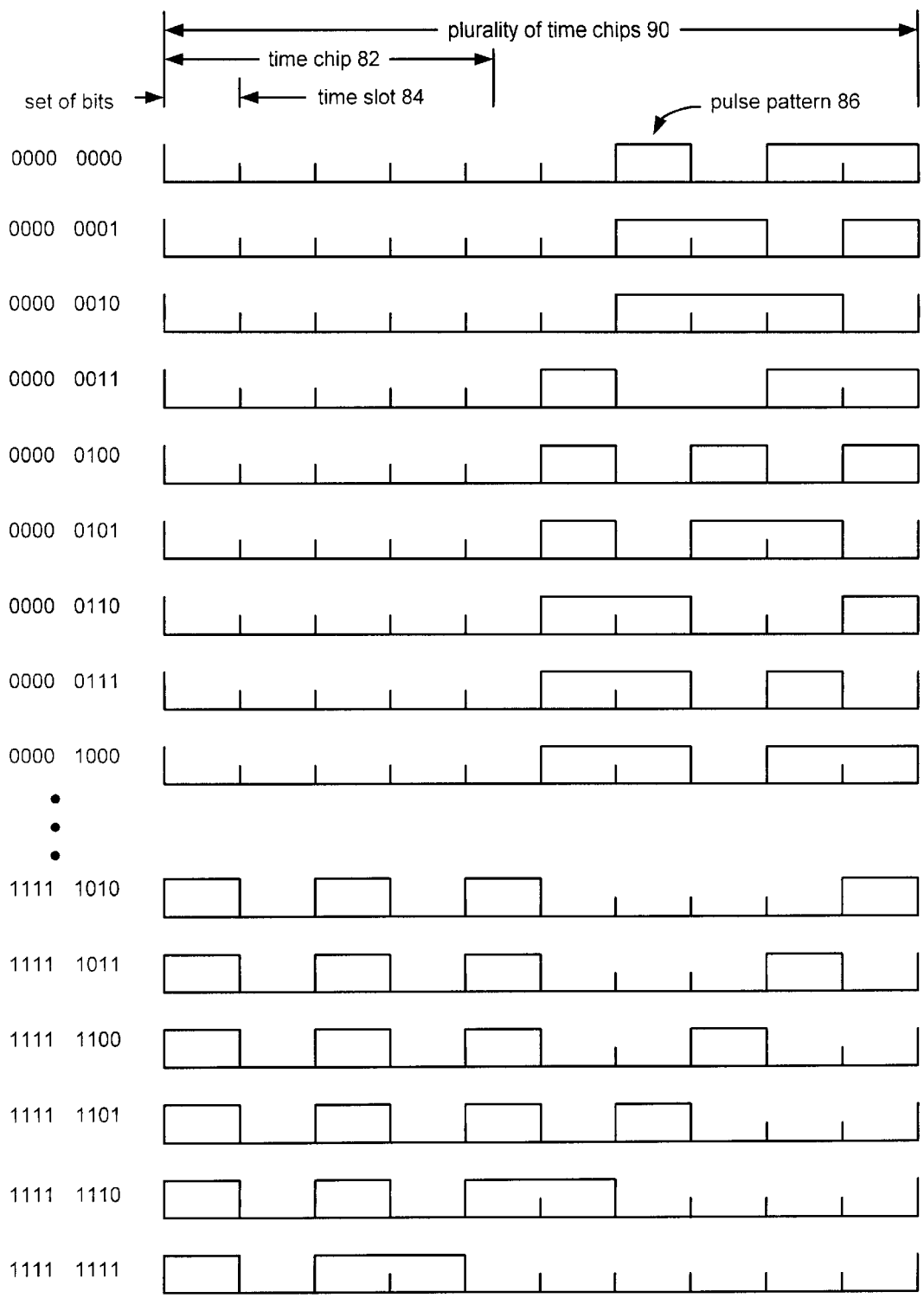
FIG. 6 illustrates yet another pulse pattern modulation technique in accordance with the present invention.

The pulse modulation circuit 16 also includes the amplitude modulator 56. If the amplitude modulator is enabled by the encoder 52, via the enable signal 75, the amplitude modulator 56 provides at least one additional bit of data encoding per grouping of time chips. As such, if the data encoding convention of FIG. 6 is used to encode the data, a data rate of 8 Mbps is obtained. If the amplitude modulator is enabled the data rate increases to 9 Mbps, 10 Mbps, or 11 Mbps, depending on the type of amplitude modulation employed. The amplitude modulation will be discussed in greater detail with reference to FIGS. 26–30. The data rate may even be further increased to 12 Mbps if the pulse patterns of FIG. 6 include patterns that include five pulses.

FIG. 4 illustrates a pulse pattern modulation technique where sets of bits 80 are encoded into pulse patterns and where pulse patterns can be decoded to retrieve the set of bits 80. The pulse patterns are derived for a single time chip 82 that includes four time slots 84. As such, the duration of the time chip may be set to 500 nSec such that it is compatible with the 4 PPM, 4 Mbps IrDA standard. In this pulse pattern encoding convention, the first four sets of bits are represented by a single pulse positioned in one of the time slots, which is identical to the 4 PPM, 4 Mbps IrDA standard. The next four pulse patterns, which are the encoded representations of the sets of bits (0100,0101, 0110, and 0111), include multiple pulses per time chip. As shown, the pulse pattern for the set of data bits 0100 has a pulse occupying the first two time slots 84 of time chip 82. The next set of data bits 0101, has a pulse that occupies the second and third time slots of the time chip 84. The set of bits 0110 has a pulse that occupies the third and fourth time slots 84 of time chip 82. The set of bits 0111 has a pulse that occupies the first time slot and a pulse that occupies the third time slot 84 of time chip 82. With these pulse patterns, six megabits of information may be transmitted by encoding the set of bits in the pattern shown in FIG. 4.

By including multiple pulses per time chip, the pulse patterns are in violation of the data representations for the 4 PPM, 4 Mbps IrDA standard for data encoding. As will be subsequently discussed with reference to FIG. 7, the data header 62, which includes a preamble and start flag, is also in violation of the data encoding for 4 PPM, 4 Mbps IrDA standard. In the IrDA standard, it is this violation that allows a demodulator to recognize the data header. As defined in the IrDA standard, the preamble and the start flag patterns occupy multiple time chips (i.e., a data header encoding convention). As such, the same data header may be used in conjunction with the present invention, which encodes the data using a data encoding convention (i.e., data is encoded into a single time slot).

To increase the data rate to 8 Mbps, the pulse patterns on the left side of FIG. 4 are amplitude modulated to produce the pulse patterns 86 shown on the right side of FIG. 4. As such, by amplitude modulating the pulse patterns 86, four bits of data may be encoded into a pulse pattern that occupies a single time chip 82. As one of average skill in the art will appreciate, the set of bits may be encoded using different pulse patterns than the ones shown in FIG. 4 and/or the set of bits may be assigned to other pulse patterns than the association shown.

FIG. 5 illustrates a pulse pattern encoding technique that divides the time chip into five time slots. In this embodiment, each time slot is 100 nanoseconds in length. Given the current state of the art of commercial LEDs and LRDs, the 100 nSec time slot is very near the operating limits of such diodes, but still very much within the reliable operating range. Each of the set of bits 80 include 4 bits and are associated with one of the pulse patterns. Thus, the pulse pattern encoding provides a data rate of 8 Mbps without amplitude modulation and 9 Mbps with amplitude modulation.

The first five sets of bits to the left of the pulse patterns are encoded by a single pulse positioned in one of the five time slots. The next 10 sets of bits are encoded by a pulse pattern having two pulses per time chip. The last set of bits (1111) is represented by pulse pattern having three pulses. In this encoding scheme, the duty cycle of the pulse patterns varies from 20 to 60 percent. As such, the DC average signal produced by the demodulator varies similarly. As is known, variations in the DC average cause a comparison circuit to lose sensitivity such that the transmission range between the modulator circuit and the demodulator circuit is reduced. Note that the adverse affects of the DC average variation may be substantially reduced by the amplitude adjusting circuit of FIG. 27, which will be discussed below.

To maintain the duty cycle between 40 and 60 percent, the set of bits 80 may be encoded by pulse patterns that include two or three pulses. The set of bits to the right of the pulse patterns corresponds to such an encoding alternative. Thus, by utilizing two or three pulses, the difference in duty cycle ranges from 40 percent to 60 percent, which keeps the corresponding DC average between 40 and 60 percent.

The pulse patterns of FIG. 5 may be further amplitude modulated to add an additional bit to the set of bits. As such, five bits of data are encoded into a single time chip, producing a 10 Mbps infrared transmission on scheme.

FIG. 6 illustrates another pulse pattern modulation technique. In this encoding scheme, multiple time chips 90 are grouped to support a single pulse pattern. As shown, two time chips 82, each having 5 time slots 84, are grouped to support a single pulse pattern. In this technique, a pulse pattern is represented by either three or four pulses positioned in any three or four time slots within the plurality of time chips 90. As such, eight bits of data may be represented in the group of time chips 90. As such, an eight Mbps data rate is obtained. By restricting the pulse patterns to include three or four pulses, the duty cycle remains between thirty and forty percent, which does not adversely affect the demodulator circuit. The accompanying table illustrates a substantial portion of the encoding of three or four pulses to achieve the eight megabits of data.

| 10 position pulse pattern (3 or 4 pulses) | decimal value of pulse pattern | pulse pattern allowed | set of bits |
|---|---|---|---|
| 00000 00111 | 7 | no | |
| 00000 01011 | 11 | | 0000 0000 |
| 00000 01101 | 13 | | 0000 0001 |
| 00000 01110 | 14 | | 0000 0010 |
| 00000 01111 | 15 | no | |
| 00000 10011 | 19 | | 0000 0011 |
| 00000 10101 | 21 | | 0000 0100 |
| 00000 10110 | 22 | | 0000 0101 |

-continued

| 10 position pulse pattern (3 or 4 pulses) | decimal value of pulse pattern | pulse pattern allowed | set of bits |
|---|---|---|---|
| 00000 10111 | 23 | no | |
| 00000 11001 | 25 | | 0000 0110 |
| 00000 11010 | 26 | | 0000 0111 |
| 00000 11011 | 27 | | 0000 1001 |
| 00000 11100 | 28 | | 0000 1010 |
| 00000 11101 | 29 | | 0000 1011 |
| 00000 11110 | 30 | | 0000 1101 |
| 00001 00011 | 35 | | |
| 00001 00101 | 37 | | |
| 00001 00111 | 39 | no | |
| 00001 01011 | 43 | | 0000 1110 |
| 00001 01100 | 44 | | 0000 1111 |
| 00001 01101 | 45 | | 0001 0000 |
| 00001 01110 | 46 | | 0001 0001 |
| 00001 10001 | 49 | | 0001 0010 |
| 00001 10010 | 50 | | 0001 0011 |
| 00001 10011 | 51 | | 0001 0100 |
| 00001 10100 | 52 | | 0001 0101 |
| 00001 10101 | 53 | | 0001 0110 |
| 00001 10110 | 54 | | 0001 0111 |
| 00001 11000 | 56 | | 0001 1000 |
| 00001 11001 | 57 | | 0001 1001 |
| 00001 11010 | 58 | | 0001 1010 |
| 00001 11100 | 60 | | 0001 1011 |
| 00010 00011 | 67 | | 0001 1100 |
| 00010 00101 | 69 | | 0001 1101 |
| 00010 00110 | 70 | | 0001 1110 |
| 00010 00111 | 71 | no | |
| 00010 01001 | 73 | | 0001 1111 |
| 00010 01010 | 74 | | 0010 0000 |
| 00010 01011 | 75 | | 0010 0001 |
| 00010 01100 | 76 | | 0010 0010 |
| 00010 01101 | 77 | | 0010 0011 |
| 00010 01110 | 78 | | 0010 0100 |
| 00010 10001 | 81 | | 0010 0101 |
| 00010 10010 | 82 | | 0010 0110 |
| 00010 10011 | 83 | | 0010 0111 |
| 00010 10100 | 85 | | 0010 1000 |
| 00010 10101 | 85 | | 0010 1001 |
| 00010 10110 | 86 | | 0010 1010 |
| 00010 11000 | 88 | | 0010 1011 |
| 00010 11001 | 89 | | 0010 1100 |
| 00010 11010 | 90 | | 0010 1101 |
| 00010 11100 | 92 | | 0010 1110 |
| 00011 10000 | 112 | | 0010 1111 |
| 00011 10001 | 113 | | 0011 0000 |
| 00011 10010 | 114 | | 0011 0001 |
| 00011 10100 | 116 | | 0011 0010 |
| 00011 11000 | 120 | | 0011 0011 |
| 00100 00011 | 131 | | 0011 0100 |
| 00100 00101 | 133 | | 0011 0101 |
| 00100 00110 | 134 | | 0011 0110 |
| 00100 00111 | 135 | no | |
| 00100 01001 | 137 | | 0011 0111 |
| 00100 01010 | 138 | | 0011 1000 |
| 00100 01011 | 139 | | 0011 1001 |
| 00100 01100 | 140 | | 0011 1010 |
| 00100 01101 | 141 | | 0011 1011 |
| 00100 01110 | 142 | | 0011 1100 |
| 00100 10001 | 145 | | 0011 1101 |
| 00100 10010 | 146 | | 0011 1110 |
| 00100 10011 | 147 | | 0011 1111 |
| 00100 10100 | 148 | | 0100 0000 |
| 00100 10101 | 149 | | 0100 0001 |
| 00100 10110 | 150 | | 0100 0010 |
| 00100 11000 | 152 | | 0100 0011 |
| 00100 11001 | 153 | | 0100 0100 |
| 00100 11010 | 154 | | 0100 0101 |
| 00100 11100 | 156 | | 0100 0110 |
| 00101 10000 | 176 | | 0100 0111 |
| 00101 10001 | 177 | | 0100 1000 |
| 00101 10010 | 178 | | 0100 1001 |
| 00101 10100 | 180 | | 0100 1010 |
| 00101 11000 | 184 | | 0100 1011 |
| 00110 00001 | 193 | | 0100 1100 |
| 00110 00010 | 194 | | 0100 1101 |

| 10 position pulse pattern (3 or 4 pulses) | decimal value of pulse pattern | pulse pattern allowed | set of bits |
|---|---|---|---|
| 00110 00011 | 195 | | 0100 1110 |
| 00110 00100 | 196 | | 0100 1111 |
| 00110 00101 | 197 | | 0101 0000 |
| 00110 00110 | 198 | | 0101 0001 |
| 00110 01000 | 200 | | 0101 0010 |
| 00110 01001 | 201 | | 0101 0011 |
| 00110 01010 | 202 | | 0101 0100 |
| 00110 01100 | 204 | | 0101 0101 |
| 00110 10000 | 208 | | 0101 0110 |
| 00110 10001 | 209 | | 0101 0111 |
| 00110 10010 | 210 | | 0101 1000 |
| 00110 10100 | 212 | | 0101 1001 |
| 00110 11000 | 216 | | 0101 1010 |
| 00111 00000 | 224 | | 0101 1011 |
| 00111 00001 | 225 | | 0101 1100 |
| 00111 00010 | 226 | | 0101 1101 |
| 00111 00100 | 228 | | 0101 1110 |
| 00111 01000 | 232 | | 0101 1111 |
| 00111 10000 | 240 | | 0110 0000 |
| 01000 00011 | 259 | | 0110 0001 |
| 01000 00101 | 261 | | 0110 0010 |
| 01000 00110 | 262 | | 0110 0011 |
| 01000 00111 | 263 | no | |
| 01000 01001 | 265 | | 0110 0100 |
| 01000 01010 | 266 | | 0110 0101 |
| 01000 01011 | 267 | | 0110 0110 |
| 01000 01100 | 268 | | 0110 0111 |
| 01000 01101 | 269 | | 0110 1000 |
| 01000 01110 | 270 | | 0110 1001 |
| 01000 10001 | 273 | | 0110 1010 |
| 01000 10010 | 274 | | 0110 1011 |
| 01000 10011 | 275 | | 0110 1100 |
| 01000 10100 | 276 | | 0110 1101 |
| 01000 10101 | 277 | | 0110 1110 |
| 01000 10110 | 278 | | 0110 1111 |
| 01000 11000 | 280 | | 0111 0000 |
| 01000 11001 | 281 | | 0111 0001 |
| 01000 11010 | 282 | | 0111 0010 |
| 01000 11100 | 284 | | 0111 0011 |
| 01001 00001 | 289 | | 0111 0100 |
| 01001 00010 | 290 | | 0111 0101 |
| 01001 00011 | 291 | | 0111 0110 |
| 01001 00100 | 292 | | 0111 0111 |
| 01001 00101 | 293 | | 0111 1000 |
| 01001 00110 | 294 | | 0111 1001 |
| 01001 01000 | 296 | | 0111 1010 |
| 01001 01001 | 297 | | 0111 1011 |
| 01001 01010 | 298 | | 0111 1100 |
| 01001 01100 | 300 | | 0111 1101 |
| 01001 10000 | 304 | | 0111 1110 |
| 01001 10001 | 305 | | 0111 1111 |
| 01001 10010 | 306 | | 1000 0000 |
| 01001 10100 | 308 | | 1000 0001 |
| 01001 11000 | 312 | | 1000 0010 |
| 01010 00001 | 321 | | 1000 0011 |
| 01010 00010 | 322 | | 1000 0100 |
| 01010 00011 | 323 | | 1000 0101 |
| 01010 00100 | 324 | | 1000 0110 |
| 01010 00101 | 325 | | 1000 0111 |
| 01010 00110 | 326 | | 1000 1000 |
| 01010 01000 | 328 | | 1000 1001 |
| 01010 01001 | 329 | | 1000 1010 |
| 01010 01010 | 330 | | 1000 1011 |
| 11010 01100 | 332 | | 1000 1100 |
| 01010 10000 | 336 | | 1000 1101 |
| 01010 10001 | 337 | | 1000 1110 |
| 01010 10010 | 338 | | 1000 1111 |
| 01010 10100 | 340 | | 1001 0000 |
| 01010 11000 | 344 | | 1001 0001 |
| 01011 00000 | 352 | | 1001 0010 |
| 01011 00001 | 353 | | 1001 0011 |
| 01011 00010 | 354 | | 1001 0100 |
| 01011 00100 | 356 | | 1001 0101 |
| 01011 01000 | 360 | | 1001 0110 |
| 01011 10000 | 368 | | 1001 0111 |
| 01100 00001 | 385 | | 1001 1000 |

-continued

| 10 position pulse pattern (3 or 4 pulses) | decimal value of pulse pattern | pulse pattern allowed | set of bits |
|---|---|---|---|
| 01100 00010 | 386 | | 1001 1001 |
| 01100 00011 | 387 | | 1001 1010 |
| 01100 00100 | 388 | | 1001 1011 |
| 01100 00101 | 389 | | 1001 1100 |
| 01100 00110 | 390 | | 1001 1101 |
| 01100 01000 | 392 | | 1001 1110 |
| 01100 01001 | 393 | | 1001 1111 |
| 01100 01010 | 394 | | 1010 0000 |
| 01100 01100 | 396 | | 1010 0001 |
| 01100 10000 | 400 | | 1010 0010 |
| 01100 10001 | 401 | | 1010 0011 |
| 01100 10010 | 402 | | 1010 0100 |
| 01100 10100 | 404 | | 1010 0101 |
| 01100 11000 | 408 | | 1010 0110 |
| 01101 00000 | 416 | | 1010 0111 |
| 01101 00001 | 417 | | 1010 1000 |
| 01101 00010 | 418 | | 1010 1001 |
| 01101 00100 | 420 | | 1010 1010 |
| 01101 01000 | 424 | | 1010 1011 |
| 01101 10000 | 432 | | 1010 1100 |
| 01110 00000 | 448 | | 1010 1101 |
| 01110 00001 | 449 | | 1010 1110 |
| 01110 00010 | 450 | | 1010 1111 |
| 01110 00100 | 452 | | 1011 0000 |
| 01110 01000 | 456 | | 1011 0001 |
| 01110 10000 | 464 | | 1011 0010 |
| 01111 00000 | 480 | | 1011 0011 |
| 10000 00011 | 515 | | 1011 0100 |
| 10000 00101 | 517 | | 1011 0101 |
| 10000 00110 | 518 | | 1011 0110 |
| 10000 00111 | 519 | no | |
| 10000 01001 | 521 | | 1011 0111 |
| 10000 01010 | 522 | | 1011 1000 |
| 10000 01011 | 523 | | 1011 1001 |
| 10000 01100 | 524 | | 1011 1010 |
| 10000 01101 | 525 | | 1011 1011 |
| 10000 01110 | 526 | | 1011 1100 |
| 10000 10001 | 529 | | 1011 1101 |
| 10000 10010 | 530 | | 1011 1110 |
| 10000 10011 | 531 | | 1011 1111 |
| 10000 10100 | 532 | | 1100 0000 |
| 10000 10101 | 533 | | 1100 0001 |
| 10000 10110 | 534 | | 1100 0010 |
| 10000 11000 | 536 | | 1100 0011 |
| 10000 11001 | 537 | | 1100 0100 |
| 10000 11010 | 538 | | 1100 0101 |
| 10000 11100 | 540 | | 1100 0110 |
| 10001 00001 | 545 | | 1100 0111 |
| 10001 00010 | 546 | | 1100 1000 |
| 10001 00011 | 547 | | 1100 1001 |
| 10001 00100 | 548 | | 1100 1010 |
| 10001 00110 | 550 | | 1100 1011 |
| 10001 01000 | 552 | | 1100 1100 |
| 10001 01001 | 553 | | 1100 1101 |
| 10001 01010 | 554 | | 1100 1110 |
| 10001 01100 | 556 | | 1100 1111 |
| 10001 10000 | 560 | | 1101 0000 |
| 10001 10001 | 561 | | 1101 0001 |
| 10001 10010 | 562 | | 1101 0010 |
| 10001 10100 | 564 | | 1101 0011 |
| 10001 11000 | 568 | | 1101 0100 |
| 10010 00001 | 577 | | 1101 0101 |
| 10010 00010 | 578 | | 1101 0110 |
| 10010 00011 | 579 | | 1101 0111 |
| 10010 00100 | 580 | | 1101 1000 |
| 10010 00101 | 581 | | 1101 1001 |
| 10010 00110 | 582 | | 1101 1010 |
| 10010 01000 | 584 | | 1101 1011 |
| 10010 01001 | 585 | | 1101 1100 |
| 10010 01010 | 586 | | 1101 1101 |
| 10010 01110 | 588 | | 1101 1110 |
| 10010 10000 | 592 | | 1101 1111 |
| 10010 10001 | 593 | | 1110 0000 |
| 10010 00010 | 594 | | 1110 0001 |
| 10010 10100 | 596 | | 1110 0010 |
| 10010 11000 | 600 | | 1110 0011 |
| 10011 00000 | 608 | | 1110 0100 |
| 10011 00001 | 609 | | 1110 0101 |
| 10011 00010 | 610 | | 1110 0110 |
| 10011 00100 | 612 | | 1110 0111 |
| 10011 01000 | 616 | | 1110 1000 |
| 10011 10000 | 624 | | 1110 1001 |
| 10100 00001 | 641 | | 1110 1010 |
| 10100 00010 | 642 | | 1110 1011 |
| 10100 00011 | 643 | | 1110 1100 |
| 10100 00100 | 644 | | 1110 1101 |
| 10100 00101 | 645 | | 1110 1110 |
| 10100 00110 | 646 | | 1110 1111 |
| 10100 01000 | 648 | | 1111 0000 |
| 10100 01001 | 649 | | 1111 0001 |
| 10100 01010 | 650 | | 1111 0010 |
| 10100 01100 | 652 | | 1111 0011 |
| 10100 10000 | 656 | | 1111 0100 |
| 10100 10001 | 657 | | 1111 0101 |
| 10100 10010 | 658 | | 1111 0110 |
| 10100 10100 | 660 | | 1111 0111 |
| 10100 11000 | 664 | | 1111 1000 |
| 10101 00000 | 672 | | 1111 1001 |
| 10101 00001 | 673 | | 1111 1010 |
| 10101 00010 | 674 | | 1111 1011 |
| 10101 00100 | 676 | | 1111 1100 |
| 10101 01000 | 680 | | 1111 1101 |
| 10101 10000 | 688 | | 1111 1110 |
| 10110 00000 | 704 | | 1111 1111 |
| 10110 00001 | 705 | | |
| 10110 00010 | 706 | | |
| 10110 00100 | 708 | | |
| 10110 01000 | 712 | | |
| 10110 10000 | 720 | | |
| 10111 00000 | 736 | | |
| 11000 00001 | 769 | | |
| 11000 00010 | 770 | | |
| 11000 00011 | 771 | | |
| 11000 00100 | 772 | | |
| 11000 00101 | 773 | | |
| 11000 00110 | 774 | | |
| 11000 01000 | 776 | | |
| 11000 01001 | 777 | | |
| 11000 01010 | 778 | | |
| 11000 01100 | 780 | | |
| 11000 10000 | 784 | | |
| 11000 10001 | 785 | | |
| 11000 10010 | 786 | | |
| 11000 10100 | 788 | | |
| 11000 11000 | 792 | | |
| 11001 00000 | 800 | | |
| 11001 00001 | 801 | | |
| 11001 00010 | 802 | | |
| 11001 00100 | 804 | | |
| 11001 01000 | 808 | | |
| 11001 10000 | 816 | | |
| 11010 00000 | 832 | | |
| 11010 00001 | 833 | | |
| 11010 00010 | 834 | | |
| 11010 00100 | 836 | | |
| 11010 01000 | 840 | | |
| 11010 10000 | 848 | | |
| 11011 00000 | 864 | yes | |
| 11100 00000 | 896 | | |
| 11100 00001 | 897 | no | |
| 11100 00010 | 898 | no | |
| 11100 00100 | 900 | no | |
| 11100 01000 | 904 | no | |
| 11100 10000 | 912 | no | |
| 11101 00000 | 928 | no | |
| 11110 00000 | 960 | no | |

Note that the pulse patterns of FIG. 6 may be further amplitude modulated to further increase the data rate. If simple amplitude modulation is included, wherein all of the pulses are of a first or second amplitude level, an additional bit of information may be obtained, Thus, the simple amplitude modulation technique increases the data rate to 9 Mbps. As an alternate amplitude modulation technique, each of the first three pulses in the pattern may have varying amplitudes such that an additional three bits of data may be added. As such, 11 Mbps data rate is obtained. As yet another alternatively, an additional two bits of data may be added by amplitude modulation and amplitude adjusting. In this embodiment, the patterns are amplitude modulated based on the number of pulses such that the patterns having three pulses have a majority of the pulses having the higher level while the pulse patterns having the four pulses have a minor of the pulses having a higher level. This allows the duty cycle to have even a less variation between the pulse patterns that have three pulses and four pulses.

The pulse pattern shown in FIG. 6 may be expanded to include pulse patterns that include two, three, four, five or even six pulses per plurality of time chips 90. The issue with varying the number of pulses to such a degree is controlling the duty, which would vary from 20 to 60 percent. This will produce a modulation scheme that allows data to be transmitted at a higher rate than even the 11 Mbps. Of course, the duty cycle would need to be controlled to maintain a desired operating distance between the modulator and the demodulator, which can be done by the amplitude modulation and amplitude adjusting technique, refer to FIGS. 26 through 32.

As one of average skill in the art will appreciate, the duration of the time chips and times slots of FIGS. 4–6 may differ from 500 nSec and 100 nSec or 125 nSec, respectively. For example, if higher grade LEDs and LRDs are used, the duration may be decreased by as much as a factor of ten. As another example, a time chip may have a duration of 1 microsecond and include twelve 83 nSec time slots.

Figure 7:
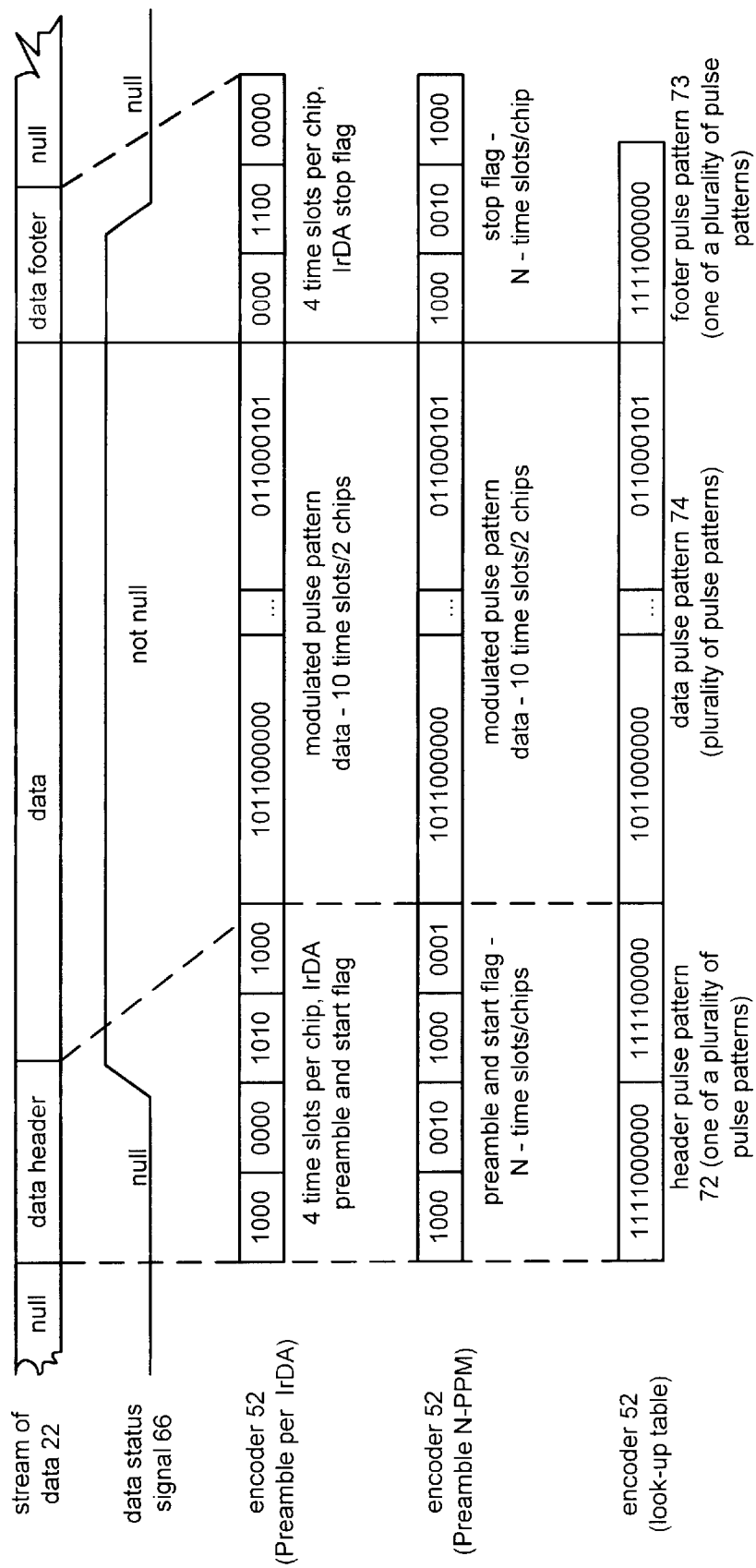
FIG. 7 illustrates a graphical representation of data transmission in accordance with the present invention.

FIG. 7 illustrates a graphical representation of data transmission in accordance with the present invention. The stream of data 22 includes null information, a data header, data, a data footer, and null information again. Based on the data header and data footer, a data status signal 66 is created. The data status signal 66 indicates when the data is null and not null.

The encoder 52 may encode the data header based on the preamble and start flag in accordance with the IrDA standard. In this encoding scheme, the preamble is encoded along with a start flag utilizing four time slots per chip wherein the standard indicates the particular pulse positioning in each of the time chips. The encoder then encodes the data based on ten time slots per two time chips utilizing the pulse pattern technique described with reference to FIGS. 5 and 6. Alternatively, the data may be encoded based on the four time slots per chip technique discussed in FIG. 4.

The next line shows the encoder 52 encoding the preamble based on an N-PPM technique. In this technique, the preamble and start flag are encoded based on the IrDA standards for data encoding, i.e., a single pulse appears in each of the time slots. In this embodiment, the preamble and star flag are in accordance with the 4 PPM requirements while the encoded pulse patterns are in violation of the singe pulse per time chip. The encoder may encode the data utilizing the modulated pulse patterns often slots per two chips of FIGS. 5 and 6 or the four time slots per chip pulse pattern encoding of FIG. 4.

The last line has the encoder 52 utilizing the look-up table to encode the header data and the data, where the data header includes the preamble and start flag. As such, the preamble and start flag are particular patterns within the table that are specifically designated for the preamble and start flag. Thus, the only time these particular patterns would be used is to indicate the preamble and/or start flag. The data is represented by other pulse patterns stored in the look up table, which may store the pulse encoding techniques of FIGS. 4, 5 and/or 6. Note that in this last embodiment, the footer pulse pattern 73 is also one of the plurality of pulse patterns.

Figure 8:
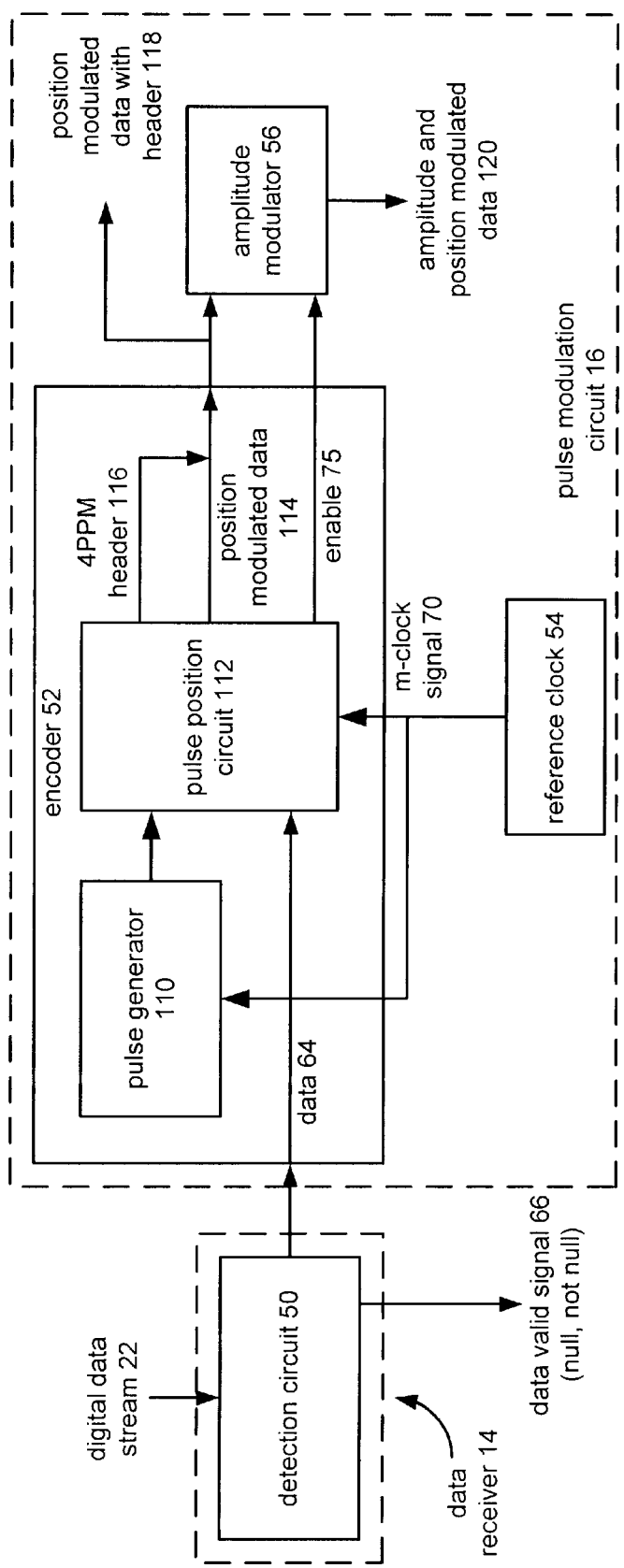
FIG. 8 illustrates a schematic block diagram of a pulse positioning modulator in accordance with the present invention.

FIG. 8 illustrates a modulator 10 that performs pulse positioning modulation. The modulator 10 includes the data receiver 14 and the pulse modulation circuit 16. The data receiver 14 includes a data detection circuit 50, which receives the digital data stream 22, produces the data valid signal 66 and provides the data 64 to the pulse modulation circuit. The function of the data detection circuit within the data receiver will be discussed subsequently with respect to FIG. 15.

The pulse modulation circuit 16 includes an encoder 52, the reference clock 54 and the amplitude modulator 56. The encoder 52 includes a pulse generator 110 and a pulse positioning circuit 112. In essence, the pulse generator 110 generates a pulse having a first pulse width or a second pulse width and the pulse positioning circuit 112 positions the pulse at any one of the plurality of time intervals to represent the data 64. In addition, the pulse position circuit 112 generates 4 PPM data header information 116 or uses any of the other schemes discussed with reference to FIG. 7.

The 4 PPM data header 116 and the pulse modulated data 114 are provided to the transmitter 77 as position modulated data with header 118. Alternatively, the header information 116 and pulse modulated data 114 are provided to the amplitude modulator 56. The amplitude modulator 56 modulates the amplitude of the data to produce amplitude and position modulated data 120, which is then provided to the transmitter 77.

Figure 9:
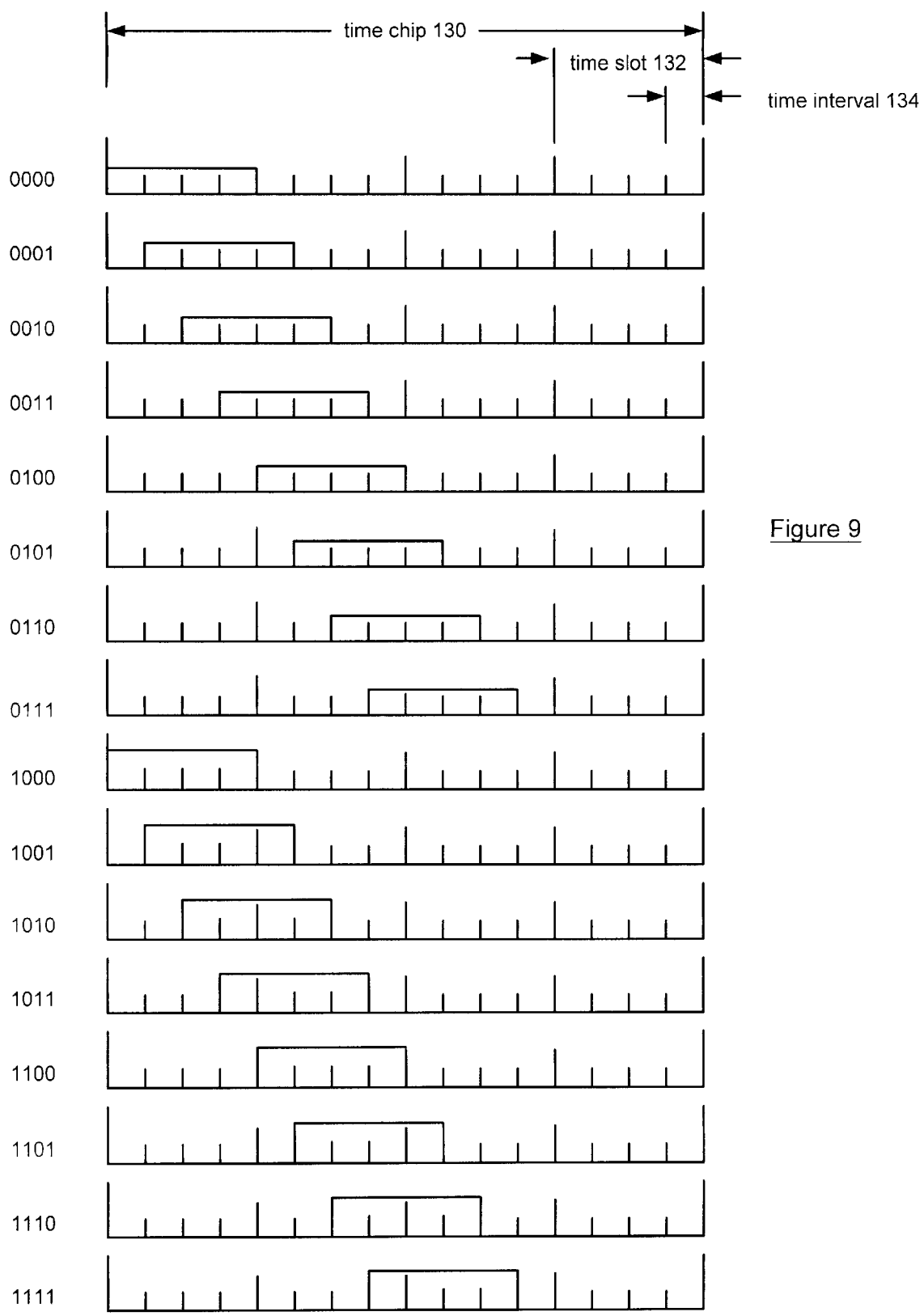
FIG. 9 illustrates a graphical representation of pulse positioning modulation in accordance with the present invention.

FIG. 9 illustrates a graphical diagram of the functionality of the pulse positioning circuit 112. As shown, the pulse position modulating technique includes a single time chip 130 that includes 4 time slots 132 wherein each time slot is further divided into 4 time intervals 134. As such, there are 16 time intervals per time chip 130. In essence, the pulse position circuit 112 positions a transition edge of the pulse at one of the time intervals to represent the particular data 64. For example, if the data is represented of the bits 0000, the pulse positioning circuit 112 would position the pulse at the beginning of the time chip. The next set of bits 0001 would have the leading transition edge of the pulse placed at the end of the first time interval. Such encoding includes, at a minimum, eight different time interval placements to represent 3 bits of data. As such, by utilizing the pulse positioning in this manner, where the transition edge, which may be the leading edge or trailing edge, is used to encode the particular set of bits yields a data rate of 6 Mbps.

To increase the data rate to 8 Mbps, the pulses may further be amplitude modulated, which is shown in the lower portion of FIG. 9. Alternatively, the pulses may have varying pulse widths to represent different data. If the pulse width is varied to represent different data the modulator and demodulator would include both leading and trailing edge encoding and decoding schemes, respectively. As an alternate to providing amplitude modulation or pulse width modulation, the time chip may be divided to smaller time intervals thereby increasing the encoding rate. As one of average skill in the art will appreciate, the pulse positioning of FIG. 9 has the pulsed positioned in overlapping time slots, which violates the IrDA standard.

FIG. 10 illustrates a schematic block diagram of a pulse pattern modulator 140 and a pulse position modulator 160. Each of the modulators 140 and 160 include memory 142, 162 and a processing unit 144, 164. The processing unit may be a microprocessor, microcontroller, digital signal processor, microcomputer, central processing unit, and/or any device that manipulates digital information based on programming instructions. The memory 142, 162 may be read-only memory, random access memory, floppy disk memory, hard drive memory, magnetic tape memory, DVD memory, CD memory, and/or any device that stores digital information.

The memory device 142 stores programming instructions, that when read by the processing unit 144, cause the processing unit 144 to function as a plurality of circuits 146–154. While executing the programming instructions, the processing unit functions as circuit 146 to receive a stream of data. Next, the processing unit functions as circuit 148 to identify a data header in the stream. Having done that, the processing unit functions as circuit 150 to encode the data header. Next the processing unit functions as circuit 152 to identify a set of bits. Then, the processing unit functions as circuit 154 to encode the set of bits. The programming instructions stored in memory 142 and performed by processing unit 144 will be discussed in greater detail with reference to FIG. 11.

The memory 162 of pulse position modulator 160 stores programming instructions that, when read by the processing unit 164, causes the processing unit to function as a plurality of circuits 166–170. While executing the program instructions, the processing unit functions as circuit 166 to receive a stream of data. Next, the processing unit functions as circuit 168 to obtain a set of bits from the data stream. Having done that, the processing unit functions as circuit 170 to position a transition edge of a pulse at a time interval. The programming instructions stored in memory 162 and performed by processing unit 164 will be discussed in greater detail with reference to FIGS. 12–14.

Figure 11:
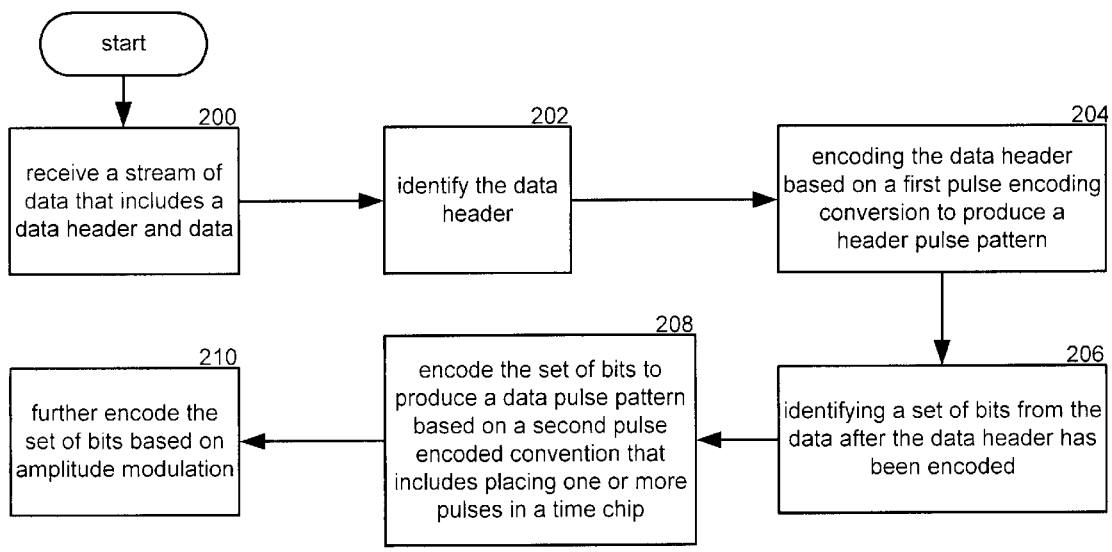
FIG. 11 illustrates a logic diagram of a method for pulse pattern modulation in accordance with the present invention.

FIG. 11 illustrates a logic diagram of a method for pulse pattern encoding a set of bits. The process begins at step 200 where a stream of data is received, wherein the stream includes a data header and data. The process then proceeds to step 202 where the data header is identified. Identification of the data header will be discussed in greater detail with reference to FIG. 15.

The process then proceeds to step 204 where the data header is encoded based on a first pulse encoding convention to produce a header pulse pattern. The first pulse encoding convention would include placing 0 or more pulses in each of the multiple time chips wherein at least one of the multiple time chips includes 0 pulses. Such an encoding convention would be similar to the header encoding process described in the 4 PPM, 4 megabit per second IrDA standard. Alternatively, the first pulse encoding convention could encode the header based on N time slots per each of the multiple time chips, where the header pulse pattern occupies multiple time chips. As yet another alternative, the first pulse encoding convention could have the data header encoded as one of the plurality of pulse patterns. The encoding of the data header was discussed in reference with FIG. 7.

The process then proceeds to step 206 where a set of bits are identified from the data once the data header has been encoded. Identifying the set of bits will depend upon the particular encoding scheme being used. For example, if the encoding scheme is the one illustrated in FIG. 4, the set of bits will include three bits, if pulse pattern modulation is only used. Alternatively, the set of bits will include four bits if the pulse pattern scheme of FIG. 4 is utilized in conjunction with amplitude modulation. As such, depending on which modulating scheme is used, i.e., the one illustrated in FIG. 4, 5, or 6, the number of bits in the set of bits will vary. Identifying these bits will be based on a pipeline technique to retrieve the appropriate number of bits in the proper grouping to produce the pulse pattern encoded signal. The process then proceeds to step 208 where the set of bits is encoded to produce a data pulse pattern. The encoding is based on a second pulse pattern encoding convention that includes placing one or more pulses in a time chip. As such, the set of bits may be encoded as shown in FIG. 4 wherein the time chip includes four slots, encoded as shown in FIG. 5 where the time chip includes five time slots, or as in FIG. 6 where two time chips include ten time slots, which, for the purposes of the second pulse encoding convention, represents a time chip. If the pulse patterns encoding schemes of FIG. 5 or 6 are used, the clock rate would have to be increased to 10 MHz.

The process then proceeds to step 210 where the encoded data bits may be further encoded by amplitude modulation. Amplitude modulation has been briefly discussed with reference to FIGS. 4 through 6 and will be discussed in greater detail with reference to FIGS. 26 through 30.

Figure 12:
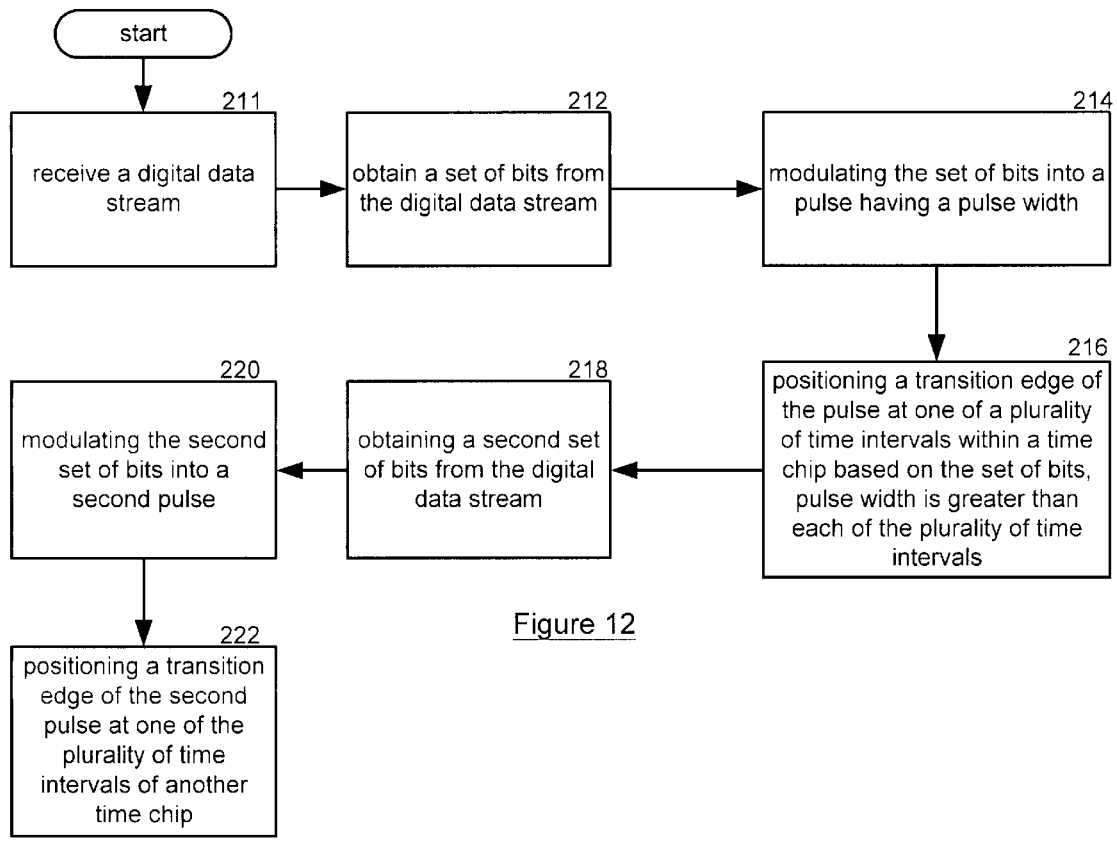
FIG. 12 illustrates a logic diagram of a method for pulse position modulation in accordance with the present invention.

FIG. 12 illustrates a logic diagram for pulse position modulation in accordance with the present invention. The process begins at 211 where a digital data stream is received. The process then proceeds to step 212 where a set of bits is obtained from the digital data streams. Having done that the process proceeds to step 214 where the set of bits is modulated into a pulse having a pulse width. The modulation scheme may be done through a table look-up such that the particular time interval location is tabulated in accordance with a particular set of bits. For example, as shown in FIG. 9, the set of bits 0000 equates to the time interval location 0. Alternatively, the modulating of the set of bits into a pulse position may be done using logic circuitry.

The process then proceeds to step 216 where a transition edge of the pulse is positioned at one of a plurality of time intervals within the time chip. Note that the width of the pulse is greater than an individual time interval. Further note that the transition edge may be leading edge or trailing edge of the pulse. Having done this, the process proceeds to step 218 where a second set of bits is obtained from the digital data stream. The process then proceeds to step 220 where the second set of bits is modulated into a second pulse. Having done that the process proceeds to step 222 where a transition edge of the second pulse is positioned at one of a plurality of time intervals of another time chip.

Figure 13:
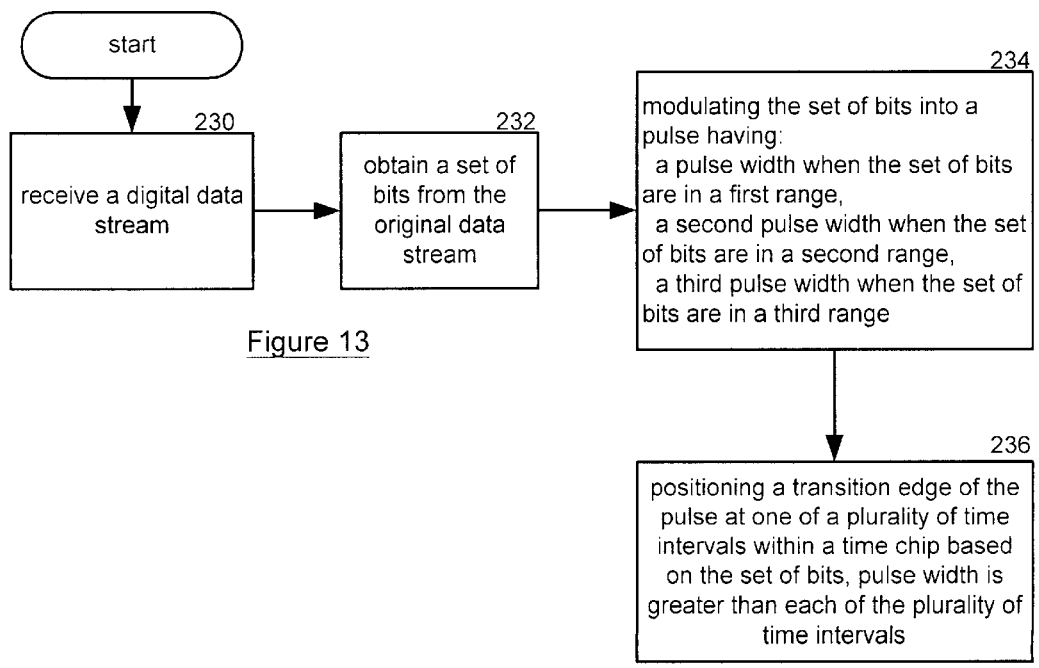
FIG. 13 illustrates a logic diagram of an alternate method for pulse position modulation in accordance with the present invention.

FIG. 13 illustrates a logic diagram of another method for pulse position modulation in accordance with the present invention. The process begins at step 230 where a digital data stream is received. The process then proceeds to step 232 where a set of bits is obtained from the digital data stream. The process then proceeds to step 234 where the set of bits is modulated into a pulse having a first pulse width when the set of bits is in a first range, a second pulse width when the set of bits is in a second range, and a third pulse width when the set of bits is in a third range. The process then proceeds to step 236 where a transition edge of the pulse is positioned at one of a plurality of time intervals within the time chip based on the value of the set of bits. Note that the pulse width is greater than each of the plurality of time intervals. By utilizing pulse width modulation, the number of bits within the set of bits may be increased or alternatively, the number of time intervals within a time chip may be decreased thereby simplifying the encoding and decoding circuitry.

Figure 14:
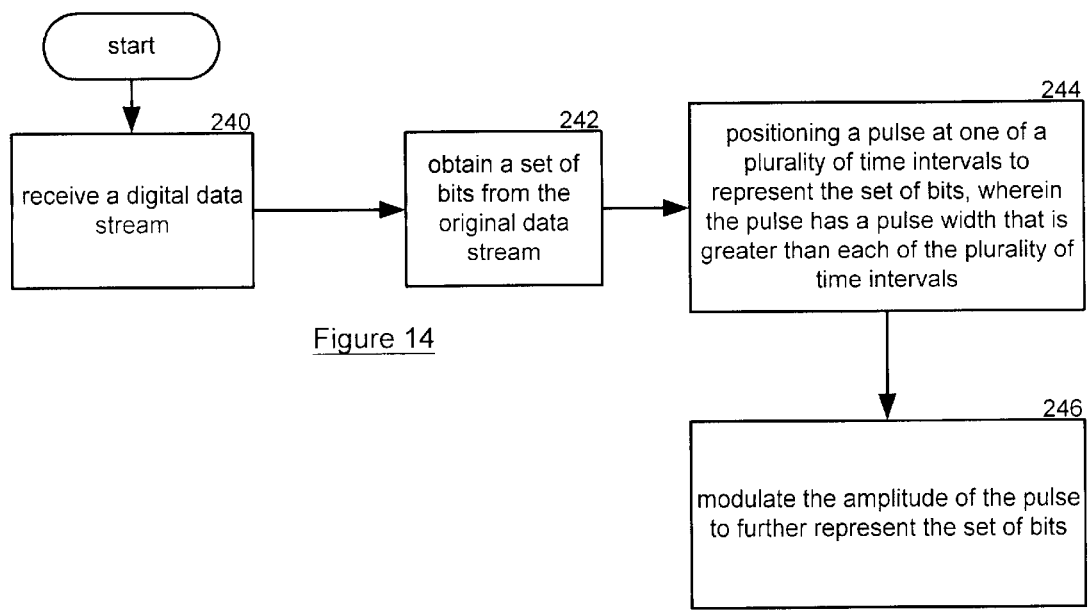
FIG. 14 illustrates a logic diagram of yet another alternate method of pulse position modulation in accordance with the present invention.

FIG. 14 illustrates a logic diagram of yet another pulse position modulation method. The process begins at step 240 where the digital data stream is received. The process then proceeds to step 242 where a set of bits is obtained from the digital data stream. The process then proceeds to step 244 where a pulse is positioned at one of the plurality of time intervals to represent the set of bits. The pulse has a pulse width that is greater than an individual time interval of the plurality of time intervals. The process then proceeds to step 246 where the amplitude of the pulse may be modulated to further represent the set of bits.

Figure 15:
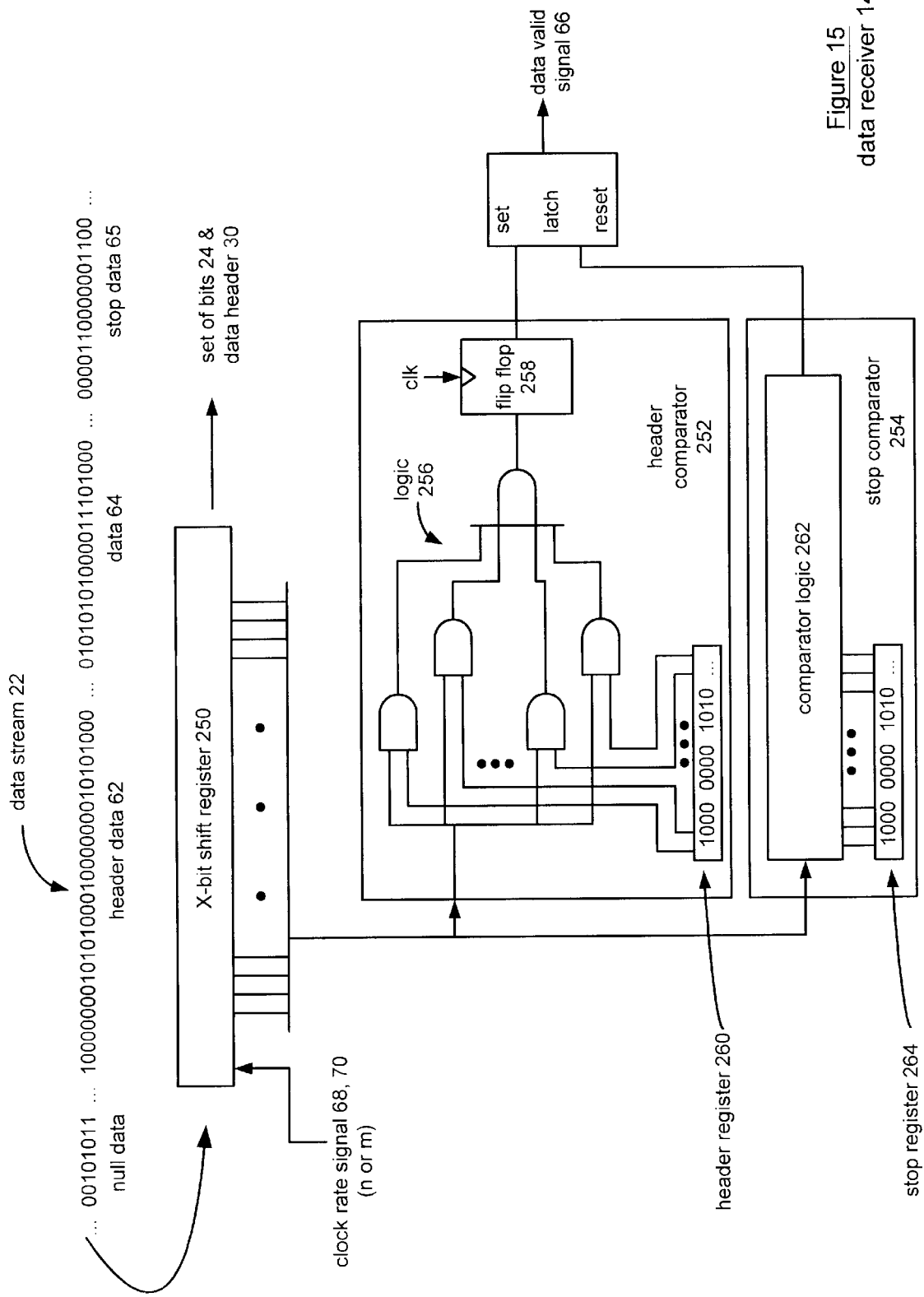
FIG. 15 illustrates a schematic block diagram of the data receiver of FIG. 1.

FIG. 15 illustrate a schematic block diagram of the data receiver 14. The data receiver 14 includes an X-bit register 250, a header comparator 252, a stop comparator 254, and a latch 255. The X-bit shift register 250, will include enough bits to store the preamble, the start flag and/or the stop flag. In addition, the number of bits in the shift register 250 will include a sufficient number to store at least one set of bits in the data stream. The shift register 250 is operably coupled to receive the stream of data 22 and output a set of bits 24 and the data header 30. The data is inputted into the shift register at the clock rate of the data header (e.g., the n-clock signal 68) or the data rate of the data (e.g., the m-clock signal 70). As each bit enters the shift register, the bits in the shift register are compared with header data and stop data by the header comparator 252 and the stop comparator 254, respectively.

To perform the comparison, the header comparator 252 includes logic circuitry 256, a flip-flop 258, and a header register 260. The header register 260 stores the particular header data. The logic circuit includes a plurality of gates to compare the data stored in the shift register with the header register. If all the bits match between the header register 260 and the shift register 250, the flip-flop 258 is set. The output of flip-flop 258 is provided to the latch 255, which, when set, produces the data valid signal 66 indicating valid data The stop comparator 254 includes comparator logic 262 and a stop register 264. The stop register 264 stores the stop pulse pattern which is compared with the data stored in the shift register 250. When the comparison logic circuit 262 determines that the data in the X-bit shift register 250 matches the data in the stop register, it resets the latch 255. When latch 255 resets, the data valid signal 66 indicates that the data is no longer valid.

Figure 16:
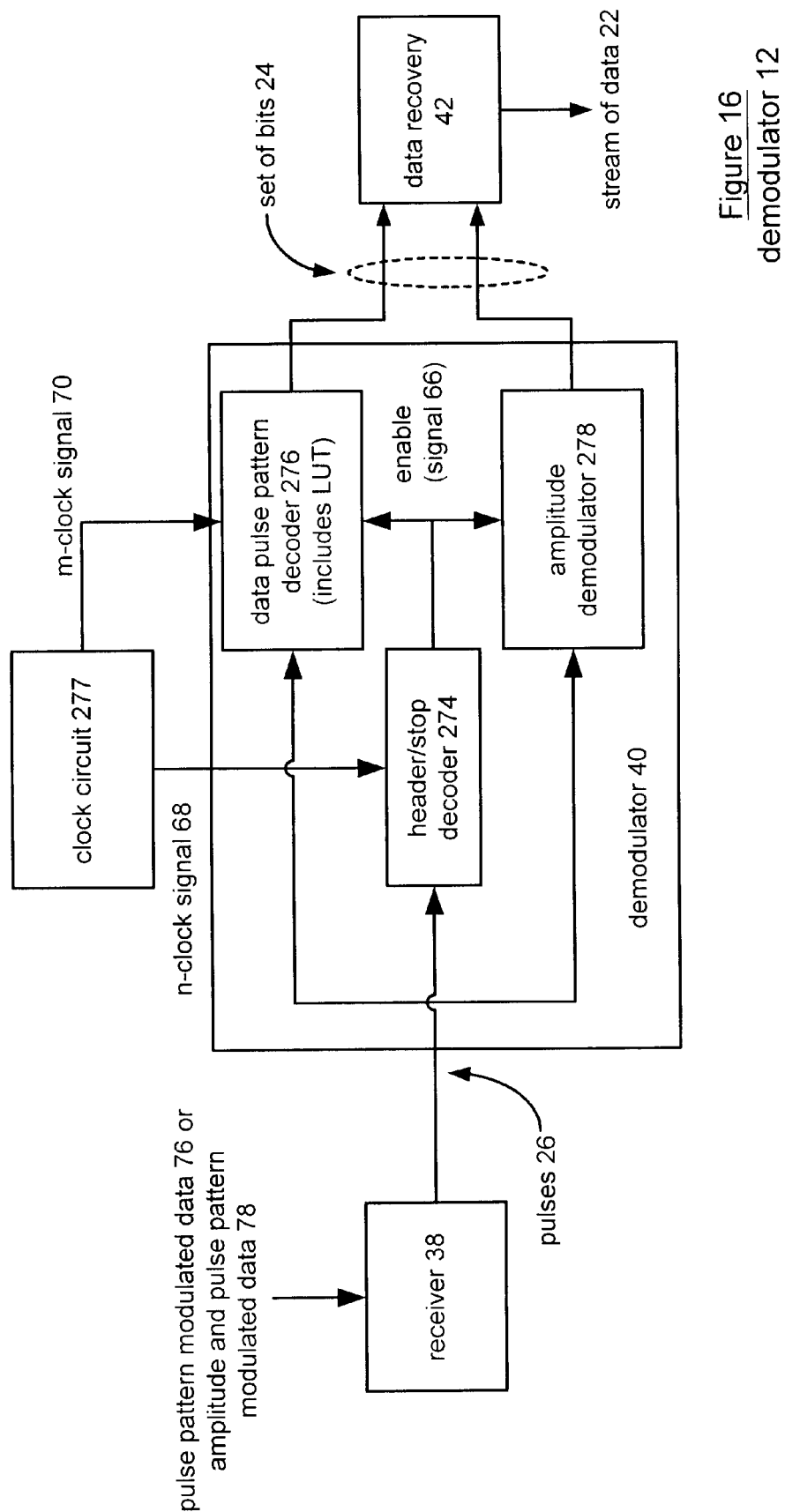
FIG. 16 illustrates a schematic block diagram of a pulse pattern demodulator in accordance with the present invention.

FIG. 16 illustrates a schematic block diagram of the demodulator 12. The demodulator 12 includes a receiver 38, a demodulator 40 and a data recovery circuit 42. The receiver 38 is operably coupled to receive pulse pattern modulated data 76 or amplitude and pulse patterned modulated data 78. The receiver 38 provides pulses 26 of the received modulated data 76 or 78 to the demodulator 40. As an alternative embodiment, the receiver 38 may include the header/stop decoder 274 and, as such, would provide the enable signal to the demodulator circuit as well as valid data.

The demodulator 40 includes a header/stop decoder 274, a data pulse pattern decoder 276, and an amplitude demodulator 278. The demodulator 40 is operably coupled to receive an n-clock signal 68 and an m-clock signal 70 from a clock circuit 277. Depending on the modulation scheme, the clock circuit will produce the appropriate clock signals. For example, if the header was encoded based on four time slots per time chip, and the data was encoded based on five time slots per time chip, the clock circuit would generate the n-clock signal 68 as an 8 MHz clock and the m-clock signal 70 as a 10 MHz clock signal. Alternatively, if the preamble, (i.e., the header data and the start flag) and the data were encoded based on the same number of time slots per time chip, the clock circuit would produce a single clock signal. For example, if both were encoded based on four time slots per 500 nSec time chip, the clock signal would be 8 MHz. As an alternate example, if both were encoded based on five time slots per 500 nSec time chip, the clock rate would be 10 MHz. Note that a handshaking protocol may need to occur between the modulator and demodulator, such that both are using the same encoding/decoding convention.

The header/stop decoder 274 is operably coupled to receive the pulses 26 and detect the header data. The details of the header/stop decoder 274 will be discussed with reference to FIG. 17 below. Upon detecting the header data, the header/stop decoder 274 provides an enable signal to the data pulse pattern decoder 276 and the amplitude demodulator 278.

When enabled, the data pulse pattern decoder 276 receives the plurality of pulses 26 and decodes them to retrieve a set of bits 24. The data pulse pattern decoder 276 may include a look-up table which corresponds to the pulse modulation and coding scheme of FIGS. 4, 5 and/or 6. Alternatively, the pulse pattern decoder may include a logic circuit to reproduce the set of bits 24 from the encoded pulses 26. If the pulses 26 include amplitude modulated information, the amplitude demodulator 278 would decode the amplitude modulated information and provide it to the data recovery circuit 42.

The data recovery circuit 42 receives, as the set of bits 24, the output of the data pulse pattern decoder 276 and the amplitude demodulator 278. As such, the data recovery circuit 42 combines the information to produce the resulting stream of data 22. As such, the data recovery circuit 42 combines the recovered bits from pulse pattern demodulation and amplitude demodulation into a digital word. The digital words are then strung together to reproduce the data stream 22.

Figure 17:
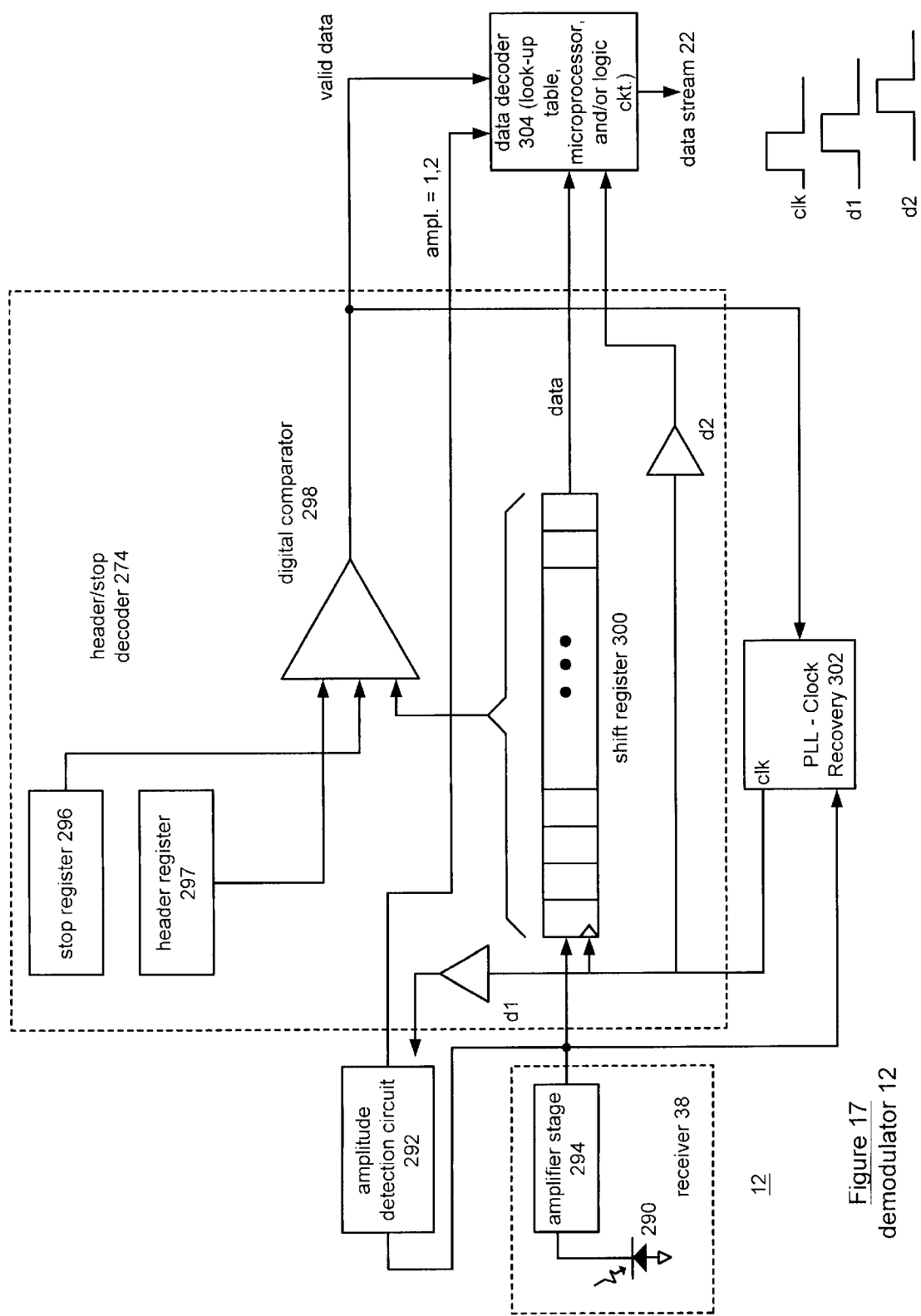
FIG. 17 illustrates a schematic block diagram of a more detailed pulse position decoder in accordance with the present invention.

FIG. 17 illustrates a schematic block diagram of the demodulator 12 that includes the receiver 38, the header/stop decoder 274, an amplitude detection circuit 292, a clock recovery circuit 302, and a data decoder 304. The receiver 38 includes a light receiving diode 290, which is operably coupled to an amplifier stage 294. The amplifier stage 294 includes circuitry, which is disclosed in co-pending patent application entitled "Data Detection Circuit Having a Pre-Amplifier Circuit", assigned to the same assignee as the present invention, having a serial number of 08/822,338, and has a filing date of Mar. 20, 1997. The output of amplifier stage 294 is provided to the input of the header/stop decoder 274 as well as the amplitude detection circuit 292. The header/stop circuit 274 includes a shift register 300, a digital comparator 298, a stop register 296 and a header register 297. The header register 297 stores header data similar to the data stored in the header register 260 of the data receiver 14. Similarly, the stop register 296 stores the corresponding stop information as that stored in stop register 264 of the data receiver 14.

The shift register 300 is operably coupled to receive the output of amplifier stage 294. The data is clocked into the shift register at a clock rate produced by the clock recovery circuit 302. For example, the clock recovery circuit may produce an 8 MHz clock signal when the data is encoded using four time slots per 500 nSec time chip. Alternatively, the clock recovery circuit could be producing a clock signal that is 10 MHz, or an integer multiple thereof for data that is encoded in five time slots per 500 nSec time chip.

As the data is entered into the shift registers 300, it is compared with the data in the header register 297 and the stop register 296. The digital comparator 298 produces a valid data signal 66 based on the comparison. The valid data signal 66 will indicate valid data once the incoming data has been favorably compared to the header data in the header register. The signal 66 will remain active until the incoming data compares favorably with the stop data stored in the stop register 296. The valid data signal 66 is provided to the data decoder 304.

The amplitude detection circuit 292 is operably coupled to receive the output of the amplifier stage at the clock rate produced by the clock recovery circuit 302. The clock rate received by the amplitude detection circuit 292, however, is delayed by d1. As the data is being received, the amplitude detection circuit 292 determines the amplitude for each pulse that is detected and provides amplitude data to the data decoder 304. Note that the functionality of the amplitude detection circuit will be discussed in greater detail with reference to FIGS. 26 through 30.

The data decoder 304, which may be a look-up table, micro-processor, and/or logic circuitry, receives the amplitude data, the data from the shift register 300, and the valid data signal 66. The inputted data is clocked into the data decoder 304 at the clock rate produced by the clock recovery circuit 302. This clock signal however, is delayed by d2. As one of average skill in the art would appreciate, the delay circuits d1 and d2 are utilized to ensure proper synchronization and pipeline processing are maintained. As one of average skill in the art will further appreciate, either or both of the delays circuits d1 and d2 may produce a zero delay.

Upon receiving the data, the data decoder 304 determines the particular set of bits 24 to produce the data stream 22. As such, the data decoder 304 may include look-up tables that correspond to the encoding schemes of FIGS. 4, 5 and/or 6.

FIG. 18 illustrates a logic diagram of a method for pulse pattern demodulation. The process begins at step 320 where a header pulse pattern and data pulse patterns are received. The header pulse pattern was encoded based on a first pulse encoding convention and the data pulse pattern was encoded based on a second pulse pattern pulse encoding convention. The second pulse encoding convention places at least one pulse in a time chip. Note that the first and second pulse pattern conventions may be the same as would be the case when the data and preamble are transmitted in four time slots per 500 nSec time chip. Note that the first decoding convention includes detecting 0 or more pulses in each of the multiple time chips that the header pulse pattern occupies. It further requires that at least one of the time chips include 0 pulses.

The process then proceeds to step 322 where the header pulse pattern is decoded based on a first pulse decoding convention that is complimentary to the first encoding convention. Note that the header pulse pattern occupies more than one time chip. Further note that the header pulse pattern may be decoded based on N time slots for each of the multiple time chips and the decoding of the data pulse pattern may be based on M time slots per time chip, where M is greater than N. Further note that the first pulse decoding convention may include a header pulse pattern that was generated in accordance with pulse position modulation techniques, or the header pulse pattern may be one of the plurality of pulse patterns that was stored in a table. As such, the header data may be encoded and subsequently decoded in a plurality of manners, some of which are shown in FIG. 7.

The process then proceeds to step 324 where the data pulse pattern is decoded based on a second pulse decoding convention that is complimentary to the second encoding convention. The decoding recaptures a set of bits. The pulse decoding convention is dependent upon the type of encoding process used which were illustrated in FIGS. 4 through 6.

The process then proceeds to step 326 where the amplitude of the data pulse pattern is demodulated.

FIG. 19 illustrates a schematic block diagram of a pulse pattern demodulator 330 that includes memory 332 and a processing unit 334. The processing unit 334 may be a microprocessor, microcomputer, microcontroller, digital signal processor, central processing unit and/or any other device that manipulates digital information based on programming instructions. The memory 332 may be read-only memory, random access memory, floppy disc memory, hard drive memory, magnetic tape memory, DVD memory, CD memory, and/or any device that stores digital information.

The memory 332 stores programming instructions that, when read by the processing unit 334, causes the processing unit 334 to function as a plurality of circuits 336, 338 and 340. While executing the programming instructions, the processing unit 334 functions as circuit 336 to receive header pulse patterns and data pulse patterns. Having done this, the processing unit 334 functions as circuit 338 to decode the header/pulse pattern and generate an enabled signal. Having done this, the processing unit functions as 340 to decode the data pulse pattern to recapture a set of bits. The programming instructions performed by the processing unit 334 were discussed in greater detail with reference to FIG. 18.

Figure 20:
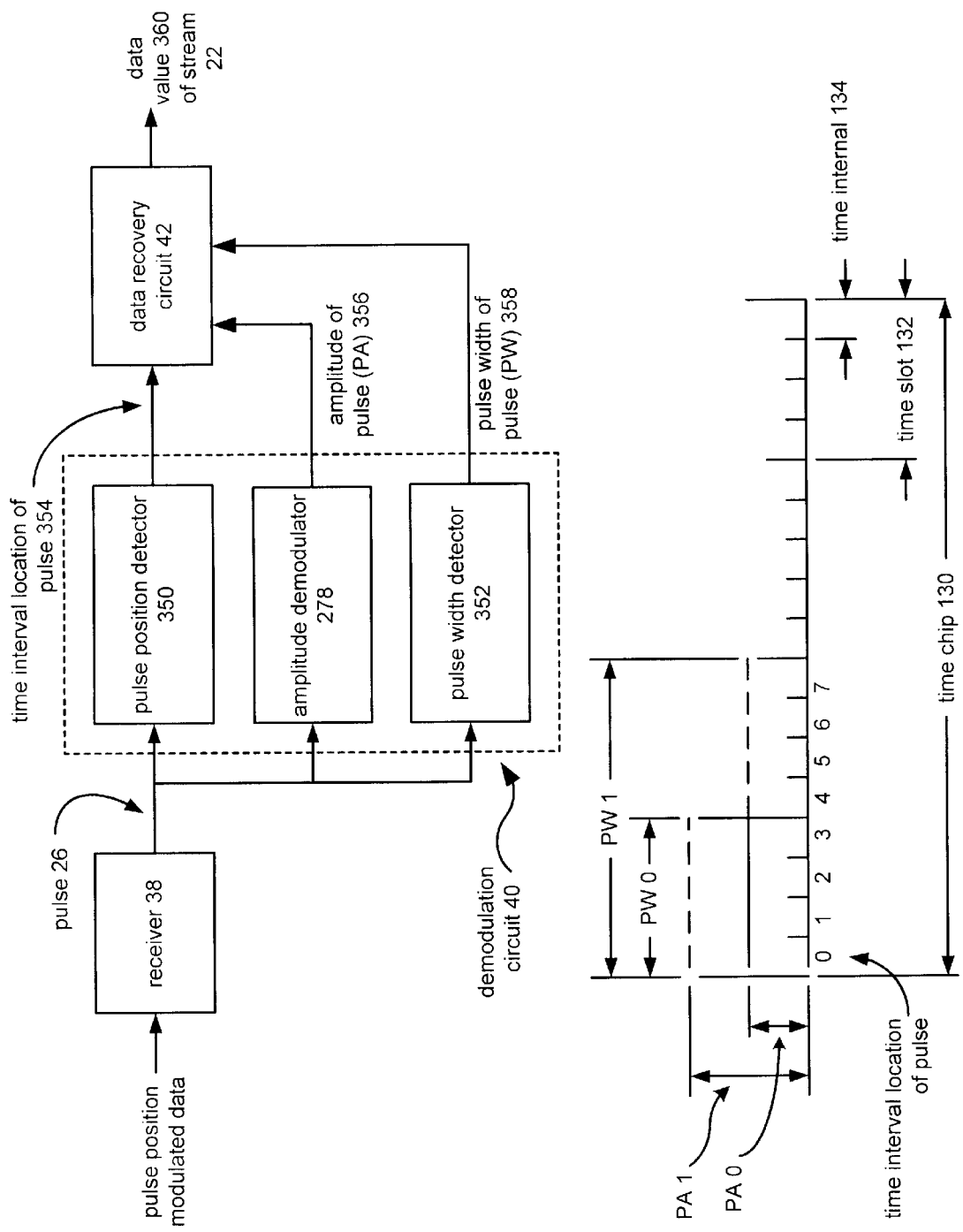
FIG. 20 illustrates a schematic block diagram of a pulse position demodulator in accordance with the present invention.

FIG. 20 illustrate a schematic block diagram of a pulse position demodulator 12. The pulse position demodulator includes the receiver 38, the demodulation circuit 40, and the data recovery circuit 42. The demodulation circuit 40 includes a pulse position detector 350, an amplitude demodulator 278, and a pulse width detector 352. The receiver 38 is operably coupled to receive pulse position modulated data and to provide a variety of pulses 26 to the demodulation circuit 40.

The pulse position detector 350 receives the pulses 26 and produces a time interval location 354 for each pulse received. Simultaneously, the amplitude demodulator 278 produces an amplitude 356 of the pulse and the pulse width detector 352 produces a pulse width 358 of the pulse. Note that if the modulation technique does not include amplitude or pulse width modulation, the demodulator circuit 40 would only include the pulse position detector.

The data recovery circuit 42 receives the time interval of pulse location 354, the amplitude of the pulse 356 and the pulse width of the pulse 358. Based on this information, the data recovery circuit produces a data value 360 of the data stream.

The graphic illustration on the bottom of FIG. 20 illustrates the functionality of the demodulator circuit 40. As shown, a time chip 130 includes four time slots 132 wherein each time slot includes four time intervals 134. A pulse having a pulse width of four time intervals, or one time slot, is shown at time interval location 0. From this information, the data recovery circuit 42 can determine the corresponding data value, or set of bits, for this particular pulse. If only pulse position modulation was used, the data value for this particular pulse would be 000. If amplitude modulation were further included, the amplitude would either be PA0, indicating the first amplitude, or PA1, indicating the second amplitude. Based on this information, the data value would be 0000 for the amplitude PA0 and a digital value of 1000 for an amplitude of PA1.

If pulse width modulation is further included, the pulse width data would be added to the data value obtained from the time interval location. As shown, the figure illustrates two pulse widths, PW0 and PW1. Note that other pulse widths may be utilized to represent data such that when the pulse is positioned at time interval location 0, the pulse may have four different pulse widths to represent additional bits (e.g., 00000, 01000, 10000, and 11000). As such, the pulse width detector 352 would need to be trained to determine what the varying pulse widths are and their corresponding data values.

Figure 21:
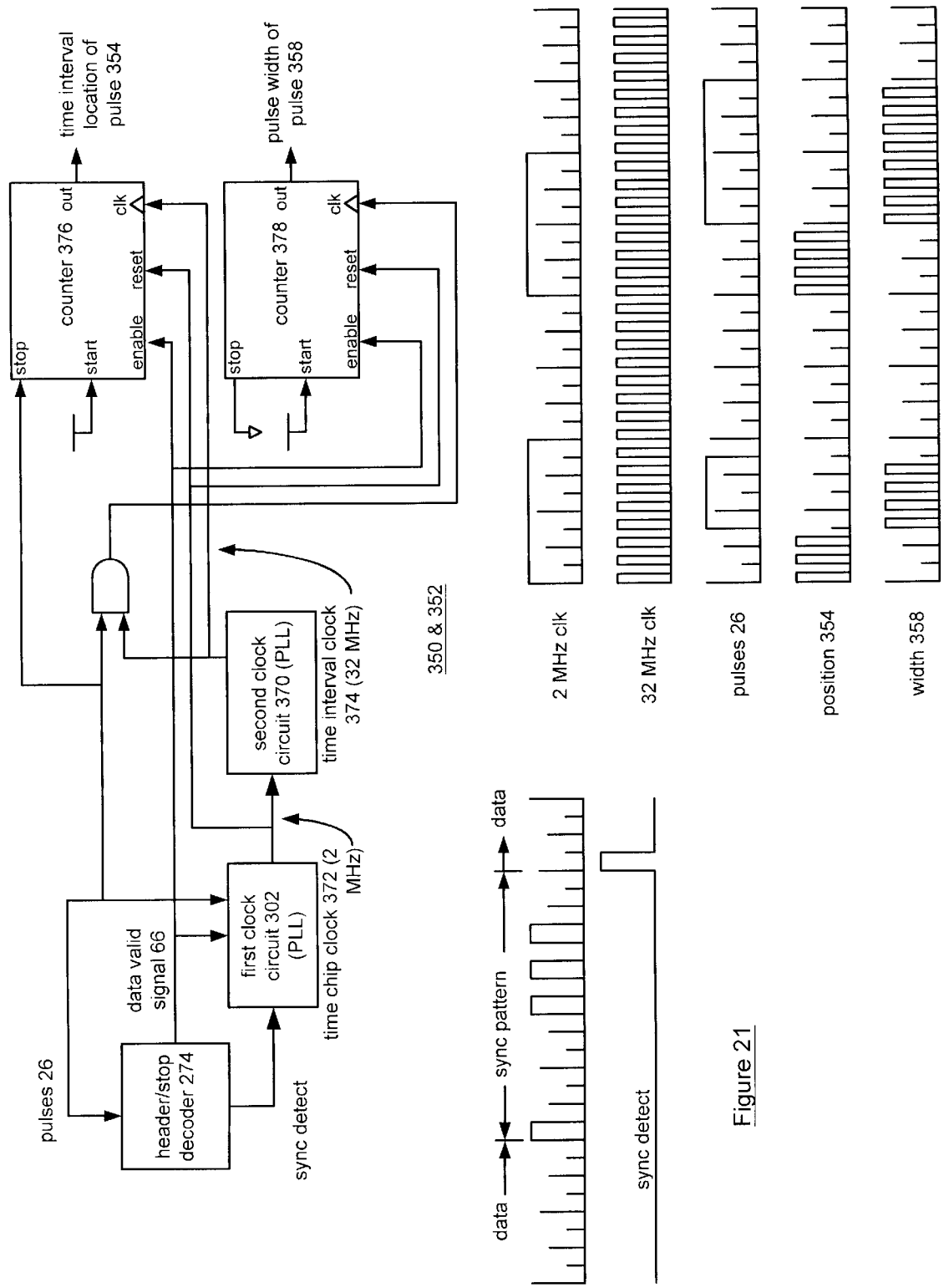
FIG. 21 illustrates a schematic block diagram of an alternate pulse position demodulator in accordance with the present invention.

FIG. 21 illustrates a more detailed schematic block diagram of the pulse position detector 350 and pulse width detector 352. The combined circuit 350 and 352 include the header/stop decoder 274, a first clock circuit 302, a second clock circuit 370, a first counter 376, and a second counter 378. The header/stop decoder circuit 274 produces the pulses 26 and a data valid signal 66 from received pulses 26. In addition, the header/stop decoder 274 provides sync detect information to the first clock circuit 302. The sync detect information generally occurs when the header (i.e., the preamble and/or start flag) is transmitted within the data. This is illustrated in the lower-left graphical representation. As shown, data is transmitted for a period of time when a sync pattern is transmitted followed by data. Upon detecting the sync pattern, a sync detect signal is produced.

The first clock circuit 302, which may include a phase lock loop, produces a time chip clock 372 based on the pulses 26 and the sync detect signal. In general, if the time chip is 500 nanoseconds, the clock rate of the first clock circuit will be 2 MHz. Such a clock circuit that incorporates a phase lock loop has been used in conjunction with existing IrDA compliant products.

The second clock circuit 370, which also may include a phase lock loop, receives the time chip clock signal 372 and produces therefrom a time interval clock signal 374. In the example shown, there are 16 time intervals per time chip. Thus, the second clock circuit 370 multiplies the time chip clock signal 372 by 16 to produce a 32 MHz clock signal.

As an alternate to the first and second clock circuits 302 and 370 being phased locked loops, the second clock circuit 370 may be phased locked loop that generates the 32 MHz clock signal from the pulses 26. The first clock circuit 302 is a 16:1 divider circuit operably coupled to divider the 32 MHz clock signal into the 2 MHz clock signal.

The first counter 376 is operable to determine the time interval location of pulses 354. The counter 376 is clocked based on the time interval clock signal 374 and is reset based on the time interval clock signal 372. The enable signal is operably coupled to receive the data valid signal. The start input is coupled high such that each time the counter is reset, the counter begins counting at the next clock cycle. The stop input of counter 376 is operably coupled to receive pulses 26. The functionality of counter 376, in view of the inputs received, is illustrated in the lower-right graphical representation. As shown, a two MHz clock signal is presented having a fifty-percent duty cycle wherein two cycles of the clock are shown. The next line illustrates a 32 MHz clock and the next line illustrates pulses 26. The first pulse which occurs in a first time chip, has a first pulse width equal to one time slot. The second pulse in pulses 26, which occurs in the second time chip, has a pulse width of two time slots. The counter 376 is reset on the leading edge of the 2 MHz clock. The counter 376 counts the clock cycles of the 32 MHz clock until the pulse is detected, which stops the counting. With regard to the first pulse, the pulse goes high at the beginning of the fourth time interval. As such, the counter 376 counts the first three clock cycles of the 32 MHz clock. From this information, the counter 376 produces a numerical value of three as the time interval location of pulses 354. The second pulse begins at the start of the fifth time interval of the second time chip shown. As such, the counter 376 counts four cycles of the 32 MHz clock before the pulse goes high. This information is also used to determine the time interval location 354 of the second pulse.

The counter 378 is used to determine the pulse width 358 of the pulses 26. The clock input of counter 378 is triggered off of the output of an AND gate, which has, as inputs, the 32 MHz signal and the pulses 26. The counter 378 is reset based on the leading edge of the two MHz clock 372 and is enabled based on the data value signal 66. The start and stop inputs of the counter 378 are coupled such that whenever a clock signal is present, the counter 378 will produce an output. Referring to the graphical representation on the lower-right portion of FIG. 21, the counter 378 counts the cycles of the 32 MHz clock while the pulse 26 is present. As such, the width 358 of the first pulse is four cycles, which is equivalent to four time intervals. The pulse width of the second pulse in the second time chip has a count of eight time intervals. As such, in these circuits 350 and 352, the pulse position and pulse widths may be readily determined of the pulses received.

Figures 22, 23:
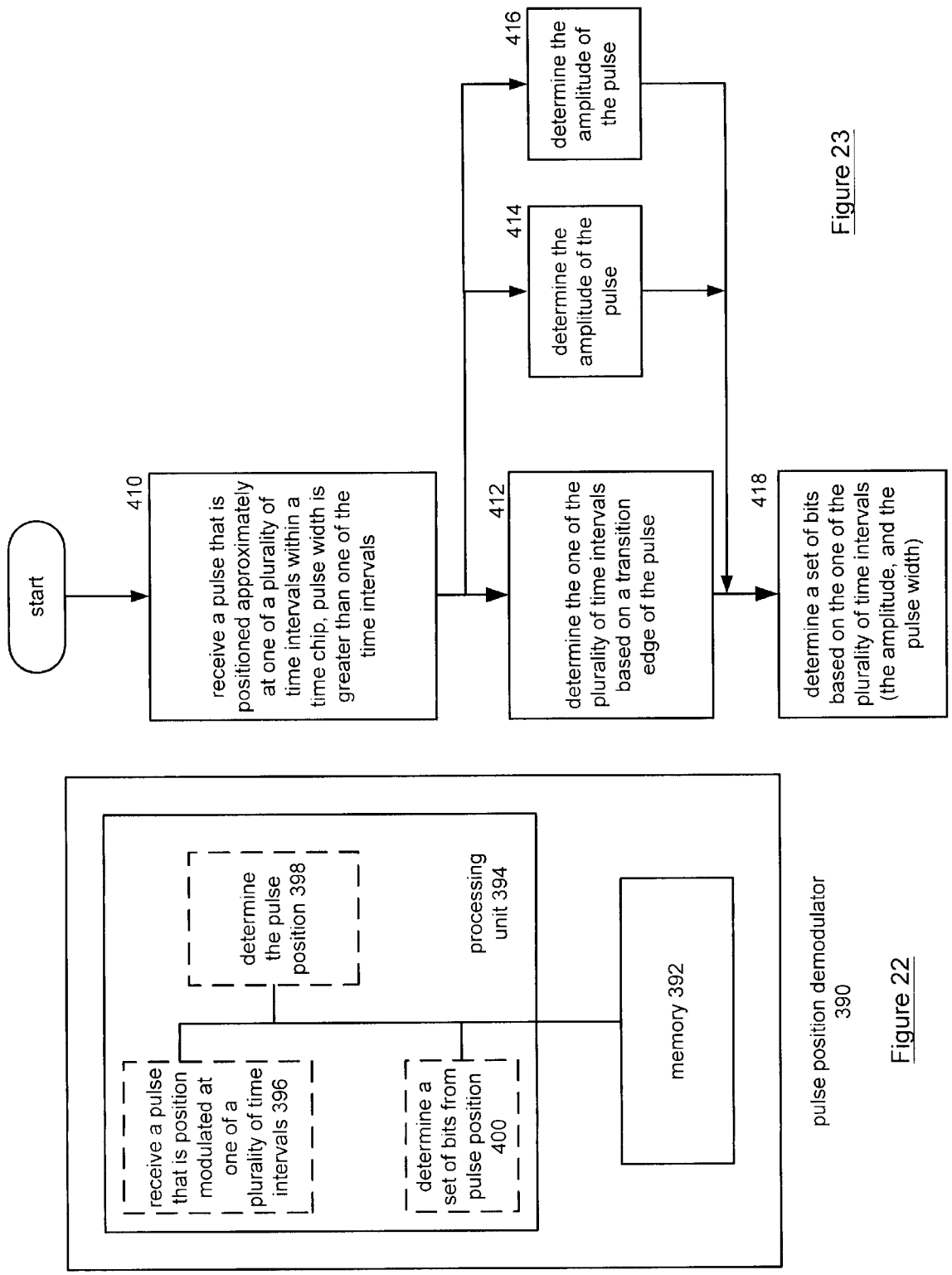
FIG. 22 illustrates yet another pulse position demodulator in accordance with the present invention.
FIG. 23 illustrates a logic diagram of a method for pulse position decoding in accordance with the present invention.

FIG. 22 illustrates a schematic block diagram of a pulse position demodulator 390. The demodulator 390 includes memory 392 and a processing unit 394. The processing unit 394 may be a microprocessor, microcontroller, digital signal processor, central processing unit and/or any other device that manipulates digital information based on programming instructions. The memory 392 may be read-only memory, random access memory, floppy disk memory, hard drive memory, magnetic tape memory, DVD memory, CD memory, and/or a device that stores digital information.

The memory 392 stores programming instructions that, when read by the processing unit 394, cause the processing unit 394 to function as a plurality of circuits 396–400. While executing the programming instructions, the processing unit functions as circuit 396 to receive a pulse that is pulse position modulated. Having done this, the processing unit functions as circuit 398 to determine the pulse position location. Having done that the processing unit functions as circuit 400 to determine a set of bits from the pulse position. The programming instructions performed by the processing unit 394 and stored in memory 392 are further discussed with reference to FIG. 23.

FIG. 23 illustrates a logic diagram of a method for demodulating pulse positioned encoded data. The process begins at step 410 where a pulse that has been positioned approximately at one of the plurality of time intervals within a time chip is received. Note that the pulse width of the pulse is greater than the width of a time interval. The process then proceeds to step 412 where the time interval location is determined based on a transition edge of the pulse. Note that either the leading edge or trailing edge of the pulse may be used to determine its particular location at one of the plurality of time intervals. Having done that, the process proceeds to step 418 where a set of bits is determined based on the time interval location. This process continues for each pulse of valid data received.

In addition to determining the pulse position, the pulse may have been amplitude modulated and/or pulse width modulated. If the pulse were amplitude modulated, the process would also include step 414. At step 14, the amplitude of the pulse is determined. At step 418 then the determination of the set of the bits is based on the pulse position as well as the amplitude of the pulse.

If the pulse were pulse width modulated, the process would include step 416. At step 416 the pulse width of the pulse is determined. Thus, at step 418, the determination of the set of bits would be based on the pulse position as well as the pulse width information. Further note that the received pulses may have been encoded via pulse positioned, amplitude modulation, and pulse width modulation.

FIG. 24 illustrates a schematic block diagram of an alternate pulse position demodulator 420. The demodulator 420 includes memory 422 and a processing unit 424. The processing unit 424 may be a micro-processor, micro controller, digital signal processor, microcomputer, central processing unit and/or any other device that manipulates digital information based on programming instructions. The memory 422 may be read-only memory, random access memory, floppy disk memory, hard disk memory, random access memory, floppy disk memory, hard disk memory, magnetic tape memory, DVD memory, CD memory, and/or any other device that stores digital information.

The memory 422 stores programming instructions that, when executed by the processing unit 422 causes the processing unit to function as a plurality of circuits 426— to receive a plurality of pulses that are pulse positioned modulated. Having done that, the processing unit functions as circuit 428 to determine the pulse position for each of the pulses. Having done that, the processing unit functions as circuit 430 to determine a set of bits from each pulse based on its position. The program instructions stored in memory 422 and executed by processing unit 424 are further discussed with reference to FIG. 25.

FIG. 25 illustrates a logic diagram of a method for demodulating pulse positioned data. The process begins at step 440 where a plurality of pulses is received. Each of the pulses in the plurality of the pulses is received in a separate time chip wherein each of the time chips includes a plurality of time intervals. The process then proceeds to step 442 where, for each pulse, a time interval position is determined. Having done that, the process proceeds to step 448 where a set of bits is determined for each pulse based on its time interval position.

If the pulses were further encoded based on amplitude modulation, the process would also include step 444. At step 444, the amplitude of each of the pulses is determined. Thus, at step 448 the set of bits for each pulse would be determined based on the time interval positioning as well as the amplitude information.

If the pulses were further encoded based on pulse width information, the step of 446 would be included. At step 446, the pulse width of a pulse is determined. Thus, at step 448 the set of bits would be determined based on the pulse width information as well as the time interval positioning.

Figure 26:
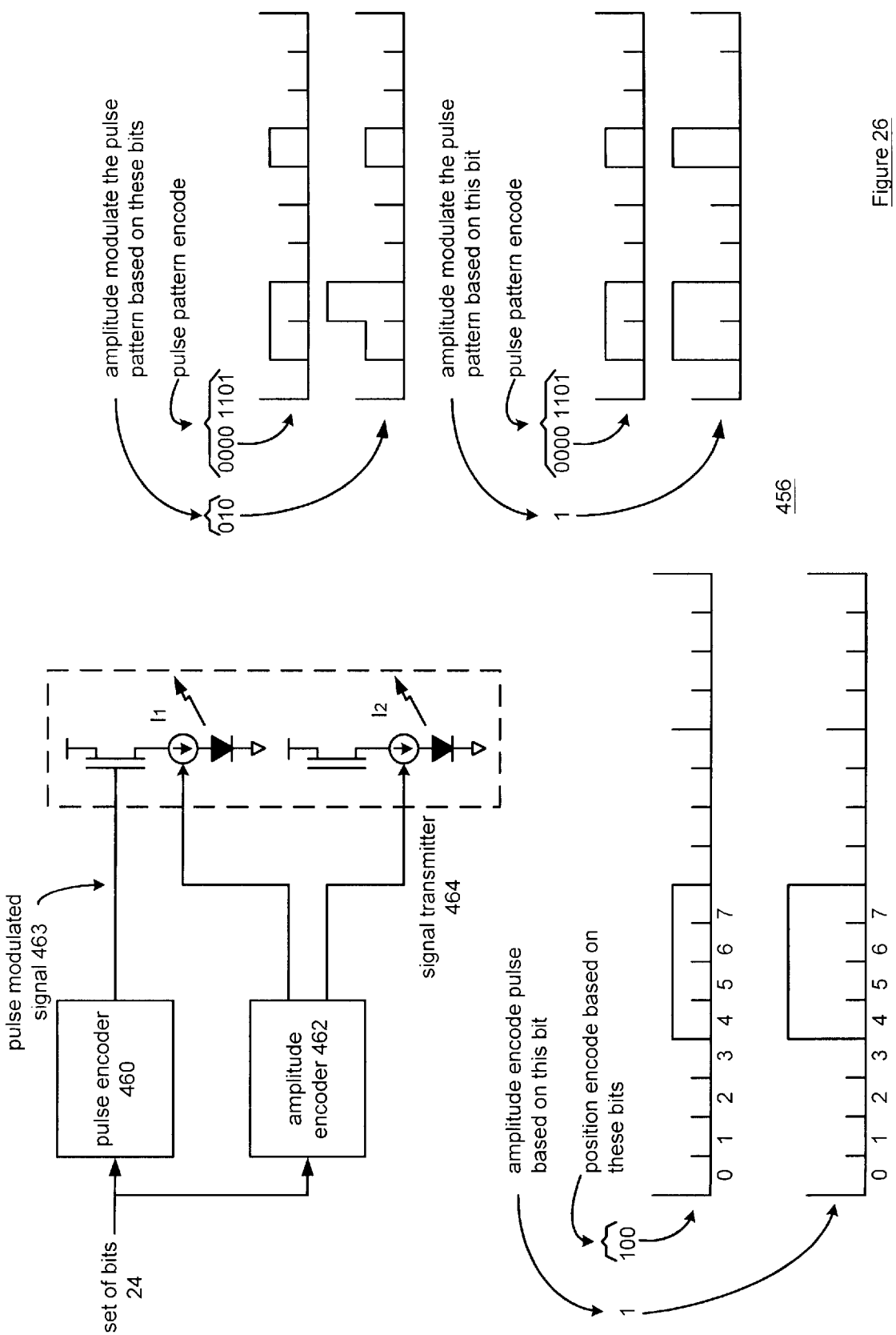
FIG. 26 illustrates a schematic block digram of an amplitude modulator in accordance with the present invention.

FIG. 26 illustrates a schematic block diagram of a pulse and amplitude modulation encoding circuit 456. The circuit 456 includes a pulse encoder 460, an amplitude encoder 462, and a signal transmitter 464. The signal transmitter 464 is shown to include a pair of light emitting diodes, a pair of current sources and a pair of transistors. Each of the transistors is coupled to the output of the pulse encoder 460, which is a pulse modulated signal 463. The current sources are operably coupled to the amplitude encoder 462. The operation of the circuit can be described with reference to the illustrations included in FIG. 26.

In the upper-right portion of FIG. 26 is a graphical representation of the set of bits 24, 010 000 1101, being encoded utilizing the present circuit. As shown, the least significant eight bits are encoded utilizing the pulse encoder 460. The pulse encoder would perform the pulse encoding function as shown in FIG. 6. Note that the pulse encoder may also encode the set of bits based on the encoding scheme shown in FIGS. 4 and/or 5.

The encoded pulse pattern is shown to include three pulses distributed within two time chips wherein each time chip includes five 100 nSec time slots. For this example, the pulse pattern includes a pulse at the second, third, and seventh time slots of the two time chip interval. As such, when the pulses are present, the pulse modulated signal 463 activates the transistors in both signal transmitting circuits of the signal transmitter 464.

The three most significant bits are encoded by the amplitude encoder 462. The amplitude encoder 462 monitors the pulse modulated signal 463 and provides a signal to the first and second current sources accordingly. Thus, for the first pulse to represent the most significant bit, the amplitude encoder 462 provides an enable signal to the first current source $I_1$ while disabling the second current source $I_2$. For the next pulse to represent the second most significant bit of 1, the amplitude encoder 462 enables both current sources $I_1$ and $I_2$. The third most significant bit is 0. Thus, the amplitude encoder 462 only enables the first current source. As one of average skill in the art would appreciate, the output power of a light emitting diode increases by the square root of two as the current is doubled. Thus, to produce a doubling of output power, the current in the second current source $I_2$ needs to be three times the current in the first current source $I_1$ to produce a total of four times the current produced by the first current source. As one of average skill in the art would also appreciate, two light emitting diodes do not need to be incorporated into the signal transmitter 464. For example, the current source may be a controlled current source wherein the amplitude encoder 462 provides a control signal to the current source, thereby producing the desired output powers As an alternate embodiment of the amplitude encoder 462, it may be constructed such that it either provides a first level amplitude or a second level amplitude. A graphical representation for this embodiment is shown on the lower-right portion of FIG. 26. As with the previous graphic representation, the least significant eight bits are encoded by the pulse encoder 460. The most significant bit is encoded by the amplitude encoder 462. If the bit is a logic one, the amplitude encoder will enable current sources $I_1$ and $I_2$ to produce the doubled output value. If the most significant bit is a 0, the amplitude encoder will only enable current source $I_1$.

The circuit of FIG. 26 is also equally applicable for pulse position encoded data. As shown in the lower-left graphical representation, the three least significant bits of the set of bits 24 are encoded based on a position encoder, which would replace the pulse encoder 460. The amplitude encoder 462 encodes the most significant bit, which, when the bit is a one, the amplitude encoder 462 enables both current sources. When the most significant bit is a logic 0, the amplitude encoder 462 only enables the first current source. As one of average skill in the art will appreciate, the ratio between the first and second amplitudes may be any desired ratio that provides sufficient distinguishing characteristics between the two amplitudes. As such, the ratio may be in the range of 1:1.2 to 1:5.

Figure 27:
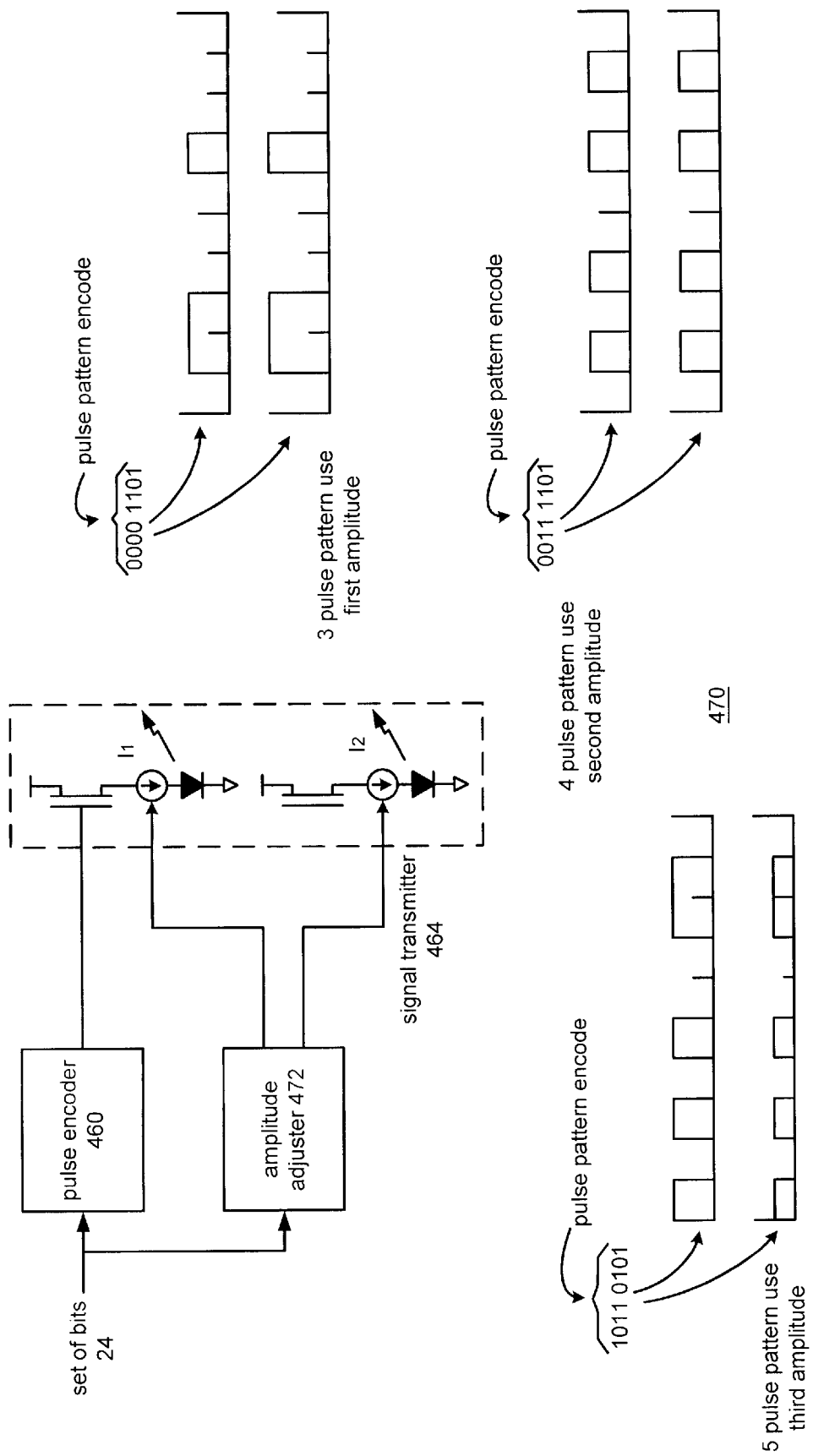
FIG. 27 illustrates a schematic block diagram of an amplitude adjusting circuit in accordance with the present invention.

FIG. 27 illustrates a schematic block diagram of a pulse encoding/amplitude adjusting circuit 470. The circuit 470 includes a pulse encoder 460, an amplitude adjuster 472, and the signal 464. This particular circuit is designed to normalize the DC average of the pulse patterns having multiple pulses. The functionality of the circuit may be described with reference to the graphical figures included herewith.

The circuit 470 functions to adjust the amplitude of the pulse pattern based on the number of the pulses includes in the pulse pattern. The fewer number of pulses in the pulse pattern, the greater number of pulses that will have the second level amplitude. As sown in the upper-right portion of FIG. 27, a pulse pattern having three pulses will cause the amplitude adjusting circuit to enable both current sources such that the resulting output has double the amplitude of the pulse pattern. In this example, the DC average will be approximately 30 percent.

The graphical representation of the lower-right portion of FIG. 27 illustrates a pulse pattern having four pulses being encoded. Based on this information, the amplitude would be adjusted to one and one-half times the first level, such that the amplitude is 0.75 times that of the amplitude of pulse patterns having only three pulses. In other words, instead of increasing the current by a factor of four, the current is increased by a factor of two such that the rest amplitude is 1.4 times the previous amplitude. In this case, the DC average of the signal is approximately twenty-eight percent (28%).

If the pulse pattern includes five pulses in the resulting pattern, the amplitude may be adjusted to a third level such that the resulting DC average is approximately thirty percent (30%). In this case, regardless of the number of pulses included in the pulse pattern, the resulting DC average is approximately the same. By maintaining the DC average, the resulting demodulator circuit does not experience a DC offset which causes the transmitter to receiver range to be decreased.

Figure 28:
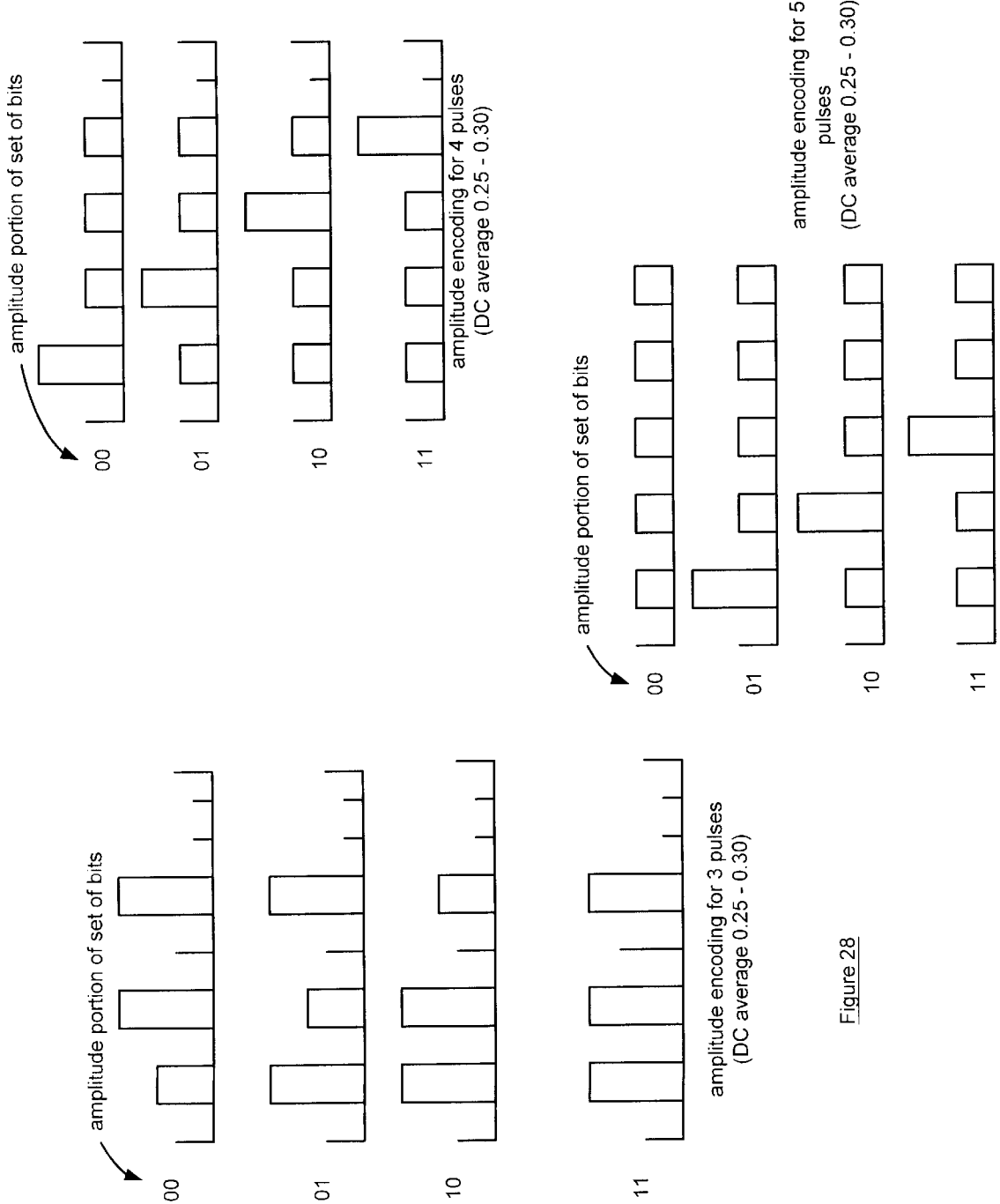
FIG. 28 illustrates a graphical representation of amplitude encoding pulse pattern encoded signals in accordance with the present invention.

FIG. 28 illustrates a graphical representation of pulse amplitude and adjusting technique, which would be performed by a combination of the circuits of FIGS. 26 and 27. As shown in the upper-left portion of FIG. 28, a pulse pattern having three pulses has been produced. To encode two bits of data utilizing amplitude modulation, the pulse pattern as shown could be utilized. For example, to encode the two bits represented by 00, the first pulse could have a first amplitude, while the second two pulses have the second amplitude. For the digital value of 01, the second pulse would have an amplitude of the first level while the other two pulses have amplitudes of the second level. By encoding in this manner, the DC average of the signal will remain between twenty-five percent (25%) and thirty percent (30%).

The graphical representation in the upper-right portion of FIG. 28 illustrates a pulse pattern that includes four pulses per pulse pattern. In this illustration, to represent two bits of data, one of the pulses would have the second the amplitude while the remaining pulses would be of the first amplitude. In this manner, the DC average of each of the signals would be twenty-five percent (25%).

The illustration at the bottom of the page shows a pulse pattern having five pulses. By utilizing a pulse/amplitude pattern where all pulses, but one, have the first level amplitude, the DC average for these signals can remain in the range of twenty-five percent (25%) to thirty percent (30%).

Figure 29:
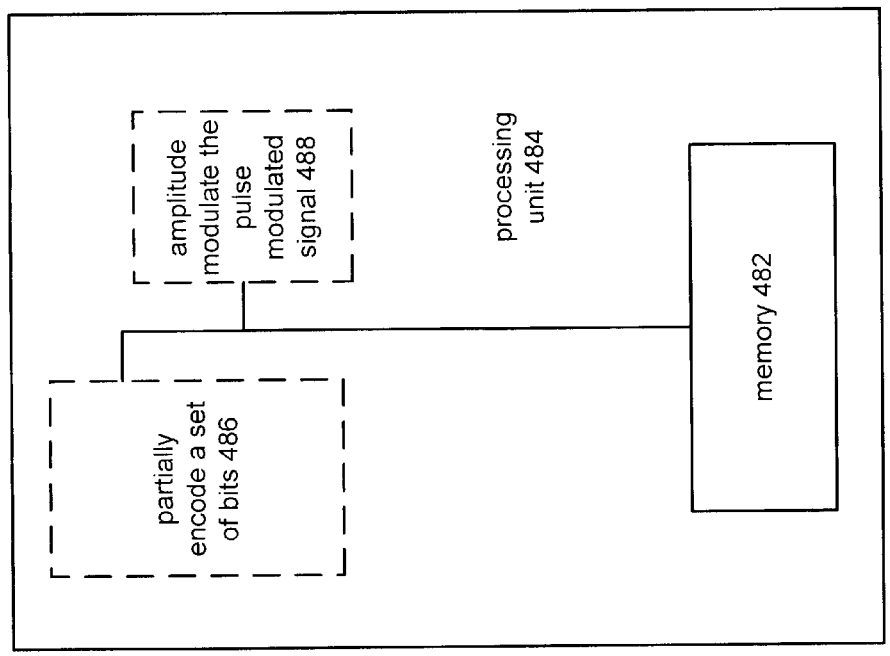
FIG. 29 illustrates a schematic block diagram of an amplitude and pulse modulator in accordance with the present invention.

FIG. 29 illustrates a schematic block diagram of an amplitude and pulse modulator 480. The modulator 480 includes a processing unit 484 and memory 482. The processing unit 484 may be a microprocessor, microcontroller, digital signal processor, microcomputer, and central processing unit and/or any other device that manipulates digital information based on programming instructions. The memory 482 may be random access memory, read-only memory, floppy disk memory, hard drive memory, magnetic tape memory, DVD memory, CD memory, and/or any other device that stores digital information.

The memory 482 stores programming instructions that, when executed by the processing unit 484, causes the processing unit to function as a plurality of circuits 486–488. While executing the programming instructions, the processing unit functions as circuit 486 to partially encode a set of bits. Having done this, the processing unit then functions as circuit 488 to amplitude modulate the partially encoded bits. The programming instructions stored in memory 482 and executed by processing unit 484 are discussed in greater detail with reference to FIG. 30.

Figure 30:
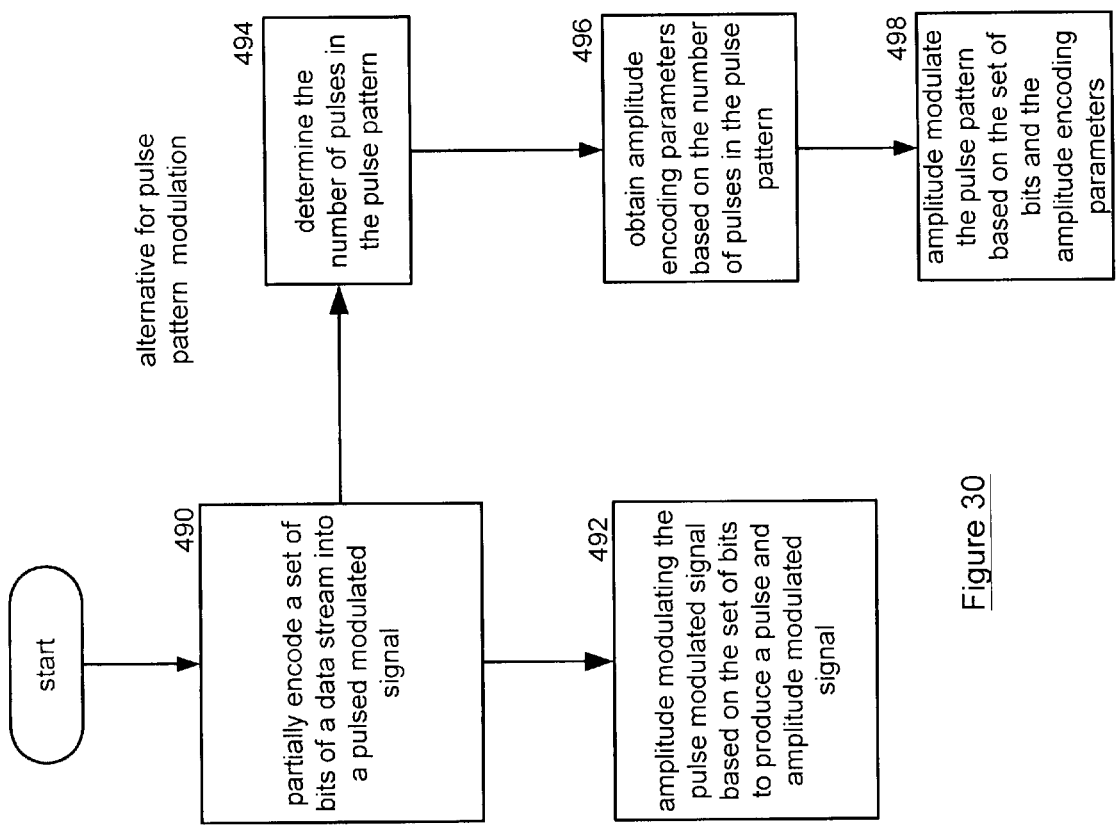
FIG. 30 illustrates a logic diagram of a method for amplitude and pulse modulation in accordance with the present invention.

FIG. 30 illustrates a logic diagram of a method for amplitude and pulse modulation. The process begins at step 490 where a set of bits is partially encoded into a pulse pattern modulated signal. Alternatively, the set of bits may be encoded into position modulated data. Having done this, the process proceeds to step 492 where the pulse modulated signal is further modulated based on amplitude modulation. As such the set of bits is represented by a pulse and amplitude modulated signal. In addition to encoding data, the programming instructions would include header information that includes amplitude training information and periodically transmitting the amplitude training information.

In an alternate pulse pattern modulation technique, after step 490, the process would proceed to step 494 where the number of pulses in the pulse pattern are determined. Having done this, the process would proceed to step 496 where amplitude encoding parameters would be obtained based on the number of pulses in the pulse pattern. The amplitude encoding parameters cause the amplifying circuit to amplify at least a majority of pulses when the number of pulses is less than a second number of pulses, where the first number of pulses may be three and the second number of pulses may be four or five. Alternatively, the encoding parameters may cause the amplifying circuit to amplify a minority of the pulses when the pulse pattern includes the second or third number of pulses. Such was illustrated with reference to FIG. 28.

The process then proceeds to step 498 where the pulse pattern is modulated based on the set of bits and the amplitude encoding parameters. As such, additional bits of information may be incorporated by modulating the amplitude such that 10 Mbps data rates can be achieved while a DC average between twenty-five percent (25%) and thirty-five percent (35%).

Figure 31:
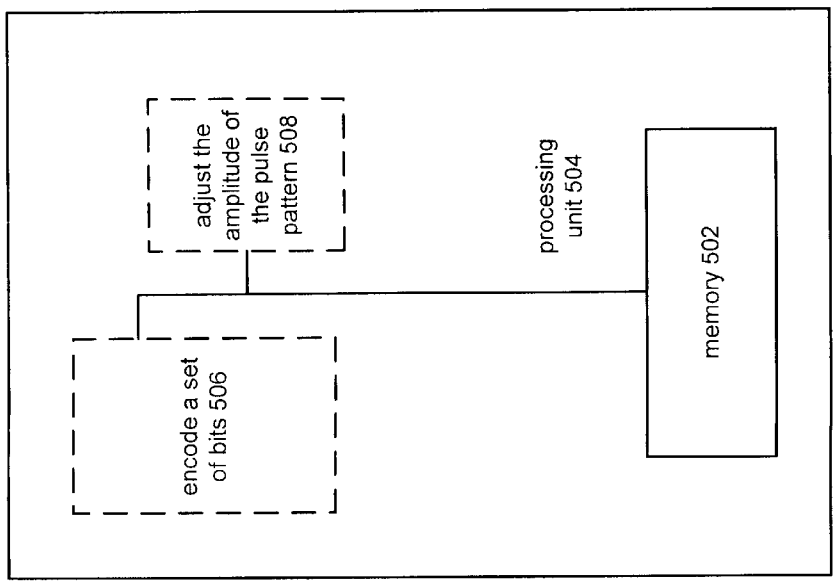
FIG. 31 illustrates a schematic block diagram of a pulse pattern modulator in accordance with the present invention.

FIG. 31 illustrates a schematic block diagram of a pulse pattern modulator 500. The pulse pattern modulator 500 includes memory 502 and a processing unit 504. The processing unit 504 may be a microprocessor, microcomputer, digital signal processor, microcontroller, central processing unit, and/or any other device that manipulates digital information based on programming instructions. The memory 502 may be read-only memory, random access memory, hard drive memory, floppy disk memory, magnetic tape memory, DVD memory, CD memory, and/or any other device that stores digital information.

The memory 502 stores programming instructions that when executed by the processing unit 504 causes the processing unit 504 to function as a plurality of circuits 506 and 508. While executing the programming instructions, the processing unit functions as circuit 506 to encode a set of bits. The processing unit then functions as circuit 508 to adjust the amplitude of the pulse pattern to achieve a more consistent DC average of the pulse patterns. The programming instructions stored in memory and executed by the processing unit 504 are more fully described with reference to FIG. 32.

Figure 32:
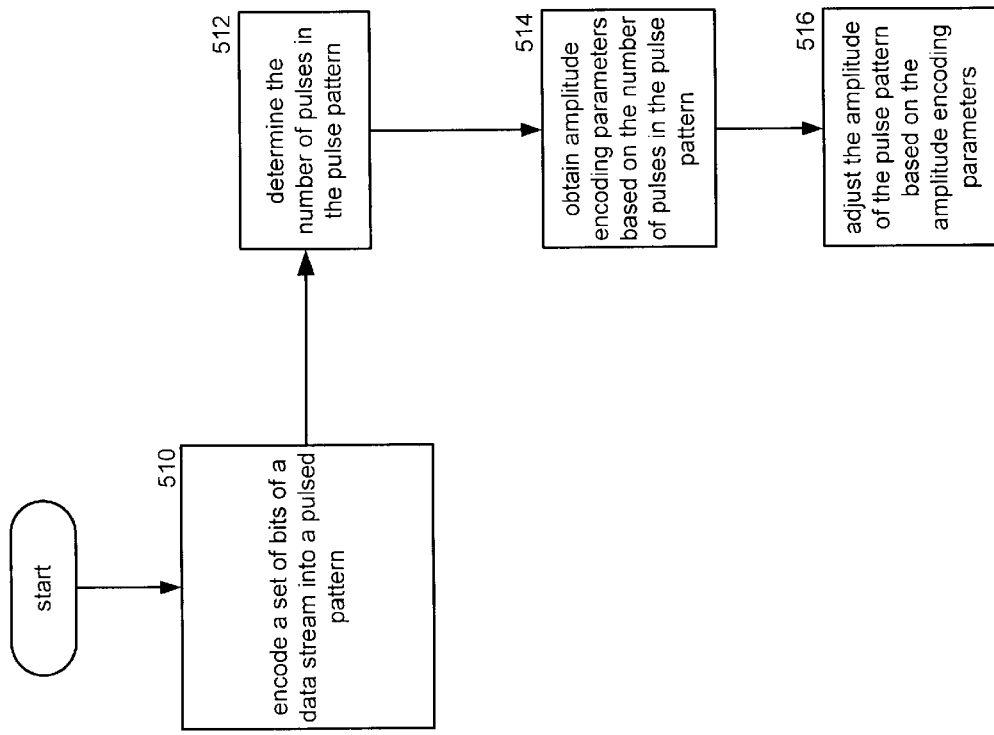
FIG. 32 illustrates a logic diagram of a method for pulse pattern modulation with amplitude adjusting in accordance with the present invention.

FIG. 32 illustrates a logic diagram of a method for amplitude adjusting pulse patterns. The process begins at step 510 where a set of bits of a data stream is encoded into a pulse pattern. The process then proceeds to step 512 where the number of pulses in the pulse pattern is determined. The process then proceeds to step 514 where amplitude encoding parameters are obtained based on the number of pulses in the pulse pattern. The process then proceeds to step 516 where the amplitude of the pulse pattern is adjusted based on the amplitude encoding parameters. Such functionality was illustrated with reference to FIG. 27.

Figure 33:
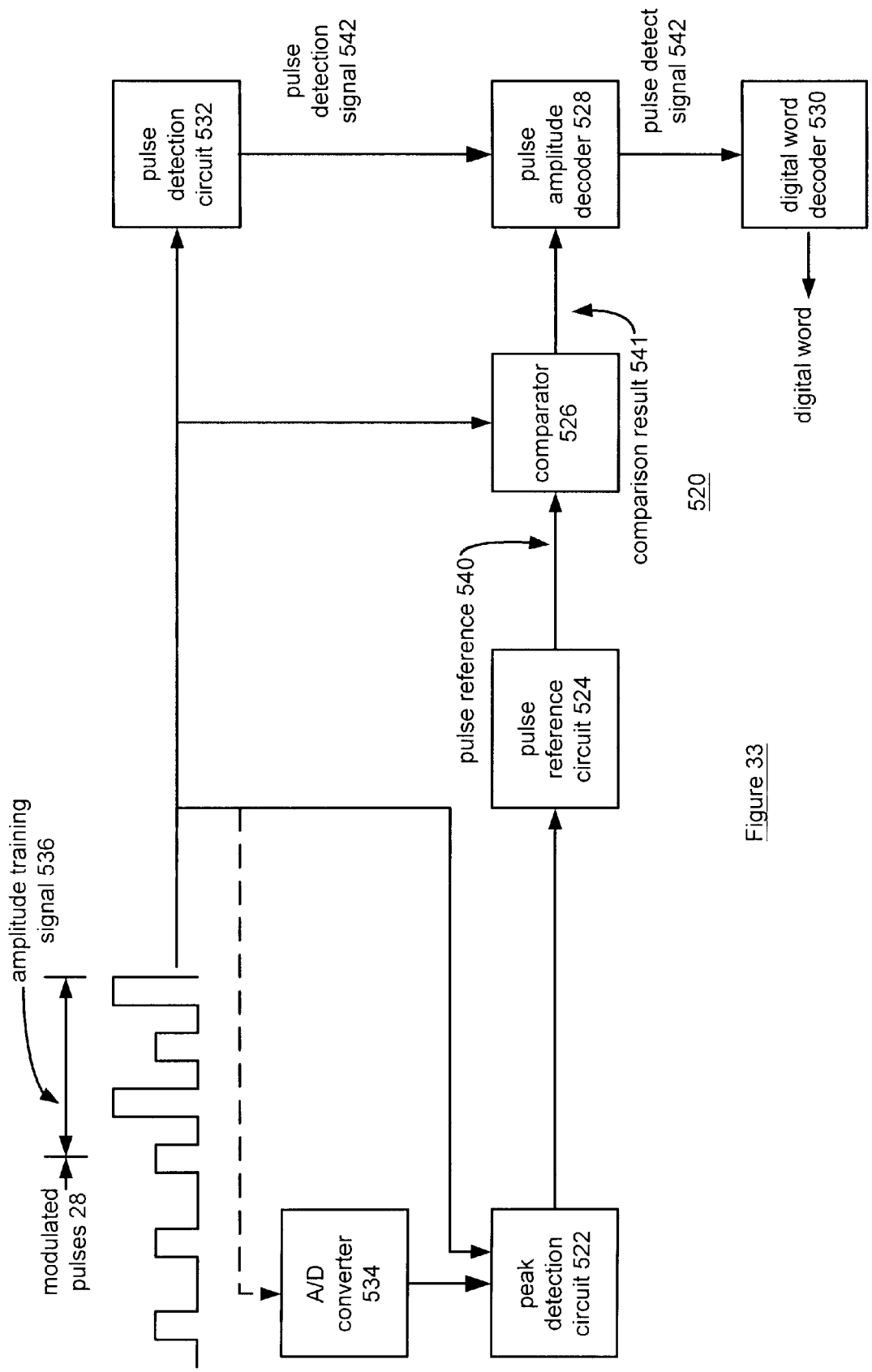
FIG. 33 illustrates a schematic block diagram of an amplitude decoding circuit in accordance with the present invention.

FIG. 33 illustrates a schematic block diagram of an amplitude and pulse decoder 520 that includes a peak detection circuit 522, a pulse reference circuit 524, a comparator 526, a pulse detection circuit 532, a pulse amplitude decoder 528, and a digital word decoder 530. The circuit 520 may be implemented in analog circuitry, or digital circuitry. If implemented in digital circuitry, the circuit would further include an analog to digital converter 534.

In operation, the peak detection circuit 522 receives the stream of data. The stream of data includes amplitude training signals 536 and modulated pulses 28. At the initial transmission of data, the amplitude training signals are used by the peak detection circuit 522 to establish a peak value 538. The peak value 538 is updated based on the amplitude training signals 536, which are periodically transmitted within the modulated pulses (e.g., every 10 mSec to every 10 seconds).

The pulse reference circuit 524 receives the peak value 538 and generates therefrom a pulse reference 540. The pulse reference is provided to the comparator, which compares the pulses of the modulated pulses 28 with the pulse reference. The comparator 526 outputs a comparison result 541 for each pulse compared.

The pulse amplitude decoder 528 receives the comparison result 541 and generates a digital state of pulses 544. The pulse amplitude decoder 528 may also receive pulse detection signals 542 from the pulse detection circuit 532. The digital word decoder 530 receives the digital state of pulses 544 and generates a digital word 546 therefrom. The functionality of circuit 520 may be further described with reference to FIG. 34.

Figure 34:
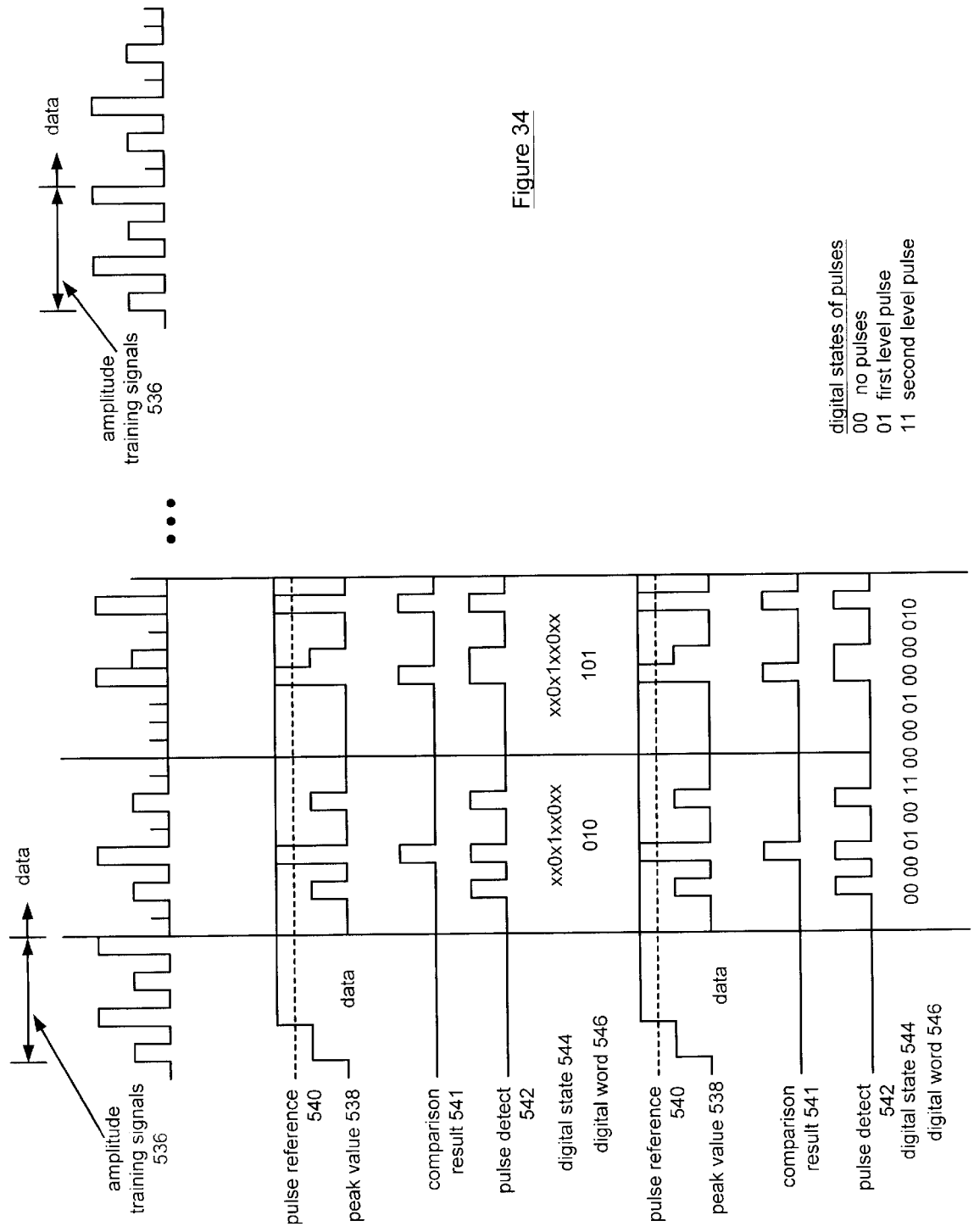
FIG. 34 illustrates a graphical representation of the amplitude decoding in accordance with the present invention.

FIG. 34 imputes a graphical representation of the functionality of the circuit shown in FIG. 33. As shown, the series of pulses are transmitted wherein the pulses include amplitude training signals 536 and data. Periodically, the amplitude training signals are retransmitted within the data. Alternatively, the peak detection circuit 522 may utilize the pulse amplitudes of the data to determine and update the peak value 538.

As shown on the left of the Figure, the peak value 538 is a relatively constant DC value. From this DC value, a pulse reference 540 is established, which is shown as the dotted line. The data is super imposed on the pulse reference such that when compared, the comparison result 541 is achieved. As such, the comparison result 541 produces a positive value, or pulse, whenever the amplitude of a pulse exceeds the pulse reference 540.

The next line shows the pulse detect output 542. The pulse detect circuit detects whenever a pulse is present. Combining the comparison results 541 with the pulse detection signal, digital states of the pulses are obtained. The pulse pattern shown is placed in two time chips, each one microsecond in duration and each includes ten time slots. As can be seen, the first two time slots of the first time chip do not contain a pulse, thus the digital state of those time slots are "don't care." The third time slot includes a pulse, but its amplitude is less than the pulse reference. As such, its digital state is a logic 0. The fourth time slot does not contain a pulse thus tits digital state is don't care. The fifth pulse has a pulse that has an amplitude that exceeds the pulse reference value 540 thus its digital state is logic one. The next two time slots do not contain a pulse thus the digital states are "don't care." The eighth time slot includes the third pulse that has an amplitude less than the pulse reference 540 thus its digital state is 0. The final two time slots do not contain a pulse, thus their digital state are "don't care." From the digital states 530 of each time slot in the time chip, the digital word 546 of 010 is obtained. The same is true for the second time chip, such that the digital word of 101 is obtained.

As an alternative embodiment, the pulse detect circuit 532 may be deleted, while the pulse reference circuit 524 generates a first and second pulse reference. This is shown in the lower portion of FIG. 34. As such, two pulse references are generated based on the peak value 538. As such one of the pulse references may be one-third of the peak value while the other is two-thirds of the peak value. As such, the comparison results are going to produce two results: one based on the comparison with the two-thirds peak value pulse reference and the other based on the one-third peak value pulse reference. These comparisons are shown as the comparison result 541. From the comparisons for each time slot within the time chip, a dial state 544 is obtained. As shown, the first two time slots do not contain a pulse, thus they are represented by the digital state of 00. The third time slot includes a pulse having the first magnitude, thus it has a digital state of 01. The fourth time slot does not contain a pulse, thus its digital state is 00. The fifth time slot contains a pulse having the second magnitude, thus it has a digital state of 11. The following two time slots contain no pulses thus are represented by the digital states 00. The next time slot has a pulse having the first amplitude thus is represented by the digital state 01. The final two time slots contain no pulses thus are represented by the digital state 00. The table just to the right illustrates the digital states of the pulses based on the comparison result. From the digital state 544, the digital word of 010 for the first time chip is obtained.

Figure 35:
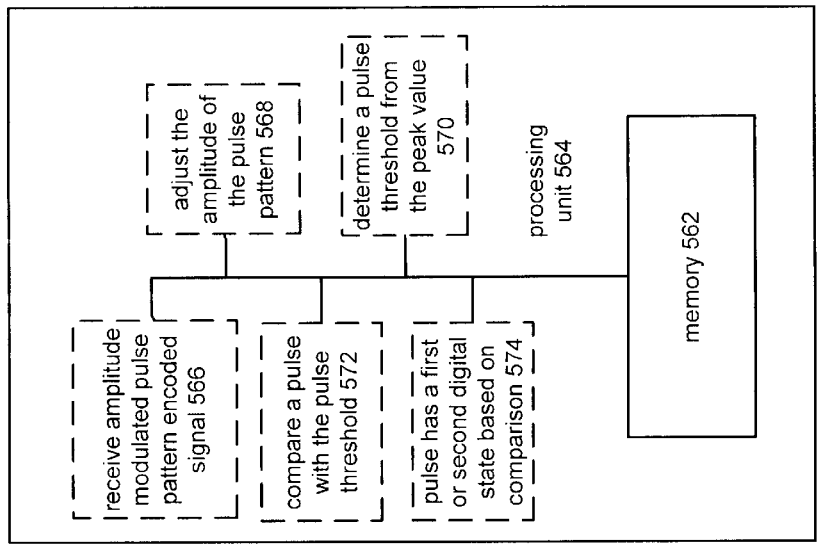
FIG. 35 illustrates a schematic block diagram of an amplitude decoder in accordance with the present invention.

FIG. 35 illustrates a schematic block diagram of an amplitude decoder 560 that includes memory 562 and a processing unit 564. The memory 562 stores programming instructions, that, when read by the processing unit 564, causes the processing unit 564 to function as a plurality of circuits 566–574. The processing unit may be a microprocessor, microcontroller, microcomputer, digital signal processor, central processing unit, and/or any device that manipulates digital information based on programming instructions. The memory 562 may be read-only memory, random access memory, floppy disk memory, bard disk memory, magnetic tape memory, DVD memory, CD memory, and/or any device that stores digital information.

The memory 562 stores programming instructions that, when executed by the processing unit 564, cause the processing unit to function as circuit 566 to receive amplitude modulated pulse pattern encoded circuits. Having done this, the processing unit then functions as circuit 568 to determine a peak value. Having done this the processing unit then functions as circuit 570 to determine a pulse threshold from the peak value. Next the processing unit functions as circuit 572 to compare a pulse of the received encoded signal with the pulse reference, or threshold. The processing unit then functions as circuit 574 to determine a first or second state of the pulse based on the comparison The programming instructions stored in memory 562 and executed by processing unit 564 may be more fully described with reference to FIG. 36.

Figure 36:
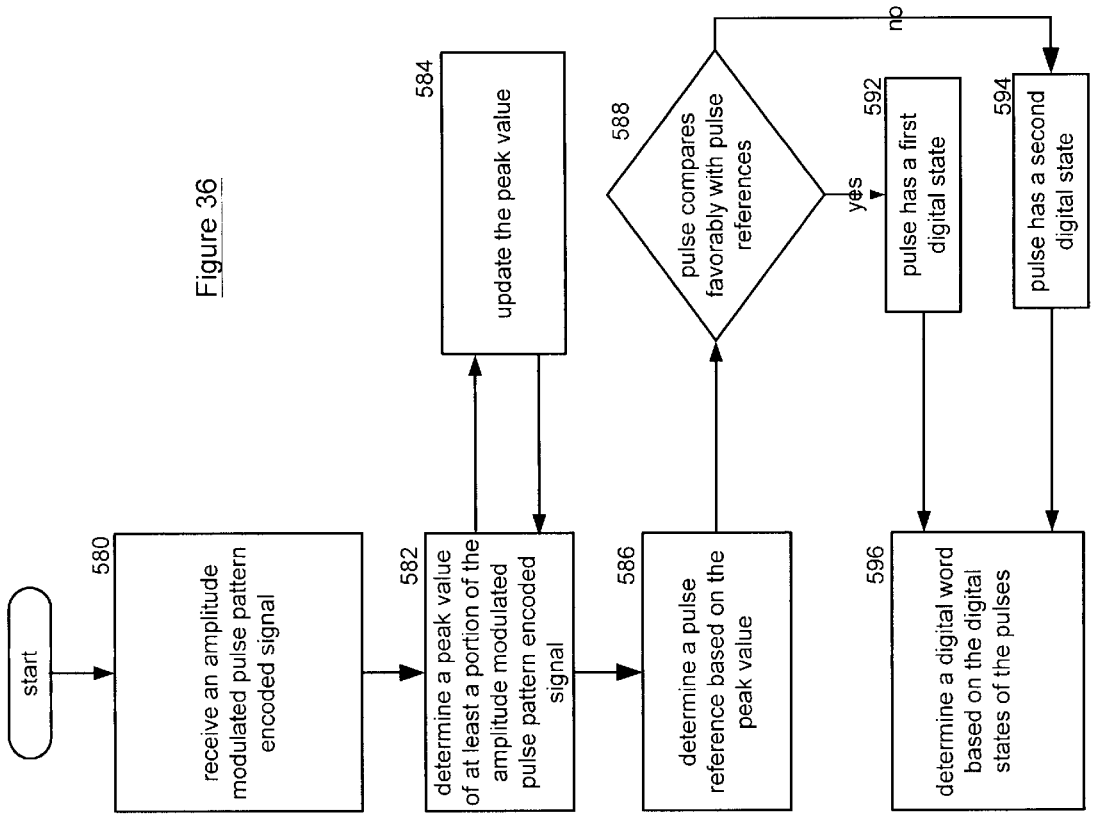
FIG. 36 illustrates a logic diagram of a method for amplitude decoding in accordance with the present invention.

FIG. 36 illustrates a logic diagram of a method for decoding amplitude modulated pulse pattern encoded signals. The process begins at step 580 where an amplitude modulated pulse pattern encoded signal is received. The process then proceeds to step 582 where a peak value of at least a portion of the amplitude modulated pulse pattern signal is determined. At least a portion may refer to the separation between when the amplitude training signals are transmitted, or based on a predetermined time interval wherein the peak value is recalculated. The amplitude training information may be included in header information, refresh information, or embedded in the data itself. Typically, the peak value will be stored for the duration of the signal portion.

When the portion expires, or a time period has elapsed, the peak value will be updated as shown at step 584. The updating may be done by obtaining the peak value from amplitude training formation, or determined based on the data values. For example, if the peak value is updated based on the data, the amplitude of the most recent pulses will be compared with the peak value. If the peak value substantially matches the peak value but does not exactly match it, the peak value will be updated to the amplitude value of the pulse. If the amplitude value of the data pulse is substantially half the peak value, but doesn't exactly match half, the peak value will be updated to twice that of the amplitude of the data.

Once the peak value has been obtained or updated, the process proceeds to 586 where a pulse reference is determined based on the peak value. As previously discussed, the pulse reference may be a single pulse reference value or a plurality of pulse reference values. The process then proceeds to step 588 where a determination is made as to whether the pulse compared favorably with the pulse references. In this example, there are two pulse references. If the comparison was favorable to one reference but not to the other, the process proceeds to step 594 where the pulse is determined to have a second digital state. If, however, the pulse compares favorably to both references, the process proceeds to 592 where the pulse has a first digital state. The process then proceeds to step 596 where a digital word is determined based on the digital states of the pulses. Such a digital word corresponds to each time chip within the signal portion.

As one of average skill in the art would appreciate, if the pulse reference includes a multitude of references, the amplitude of the pulse pattern may have several levels. Each of these levels may represent a different digital state such that a plurality of digital states may be obtained. From the plurality of digital states, the digital word would be obtained. By utilizing multiple amplitudes, the data rate may be further increased.

Figure 37:
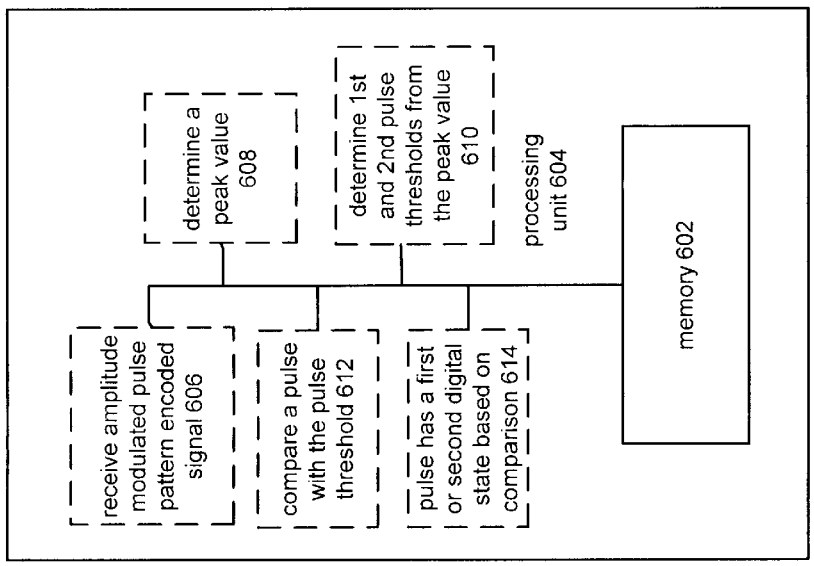
FIG. 37 illustrates a schematic block diagram of an alternate amplitude decoder in accordance with the present invention.

FIG. 37 illustrates a schematic block diagram of an alternate amplitude decoder 600 that includes memory 602 and a processing unit 604. The processing unit 604 may be a microprocessor, microcontroller, digital signal processor, microcomputer, central processing unit, and/or any device that manipulates digital information based on programming instructions. The memory 602 may be read-only memory, random access memory, floppy disk memory, hard drive memory, magnetic tape memory, DVD memory, CD memory and/or any device that stores digital information.

The memory 602 stores programming instructions that, when read by the processing unit 604, cause the processing unit 604 to function as a plurality of circuits 606–614. While executing the programming instructions, the processing unit functions as circuit 606 to receive amplitude modulated pulse pattern encoded signals. Next, the processing unit functions as circuit 608 to determine a peak value. The processing unit then functions as circuit 610 to determine first and second pulse thresholds from the peak value. The processing unit then functions as circuit 612 to compare a pulse of the received encoded signal with the pulse thresholds. Finally, the processing unit functions as circuit 614 to determine whether the pulse has a first or second digital state based on the comparison. The programming instructions stored in memory 602 and executed by processing unit 604 can be discussed in greater detail with reference to FIG. 38.

Figure 38:
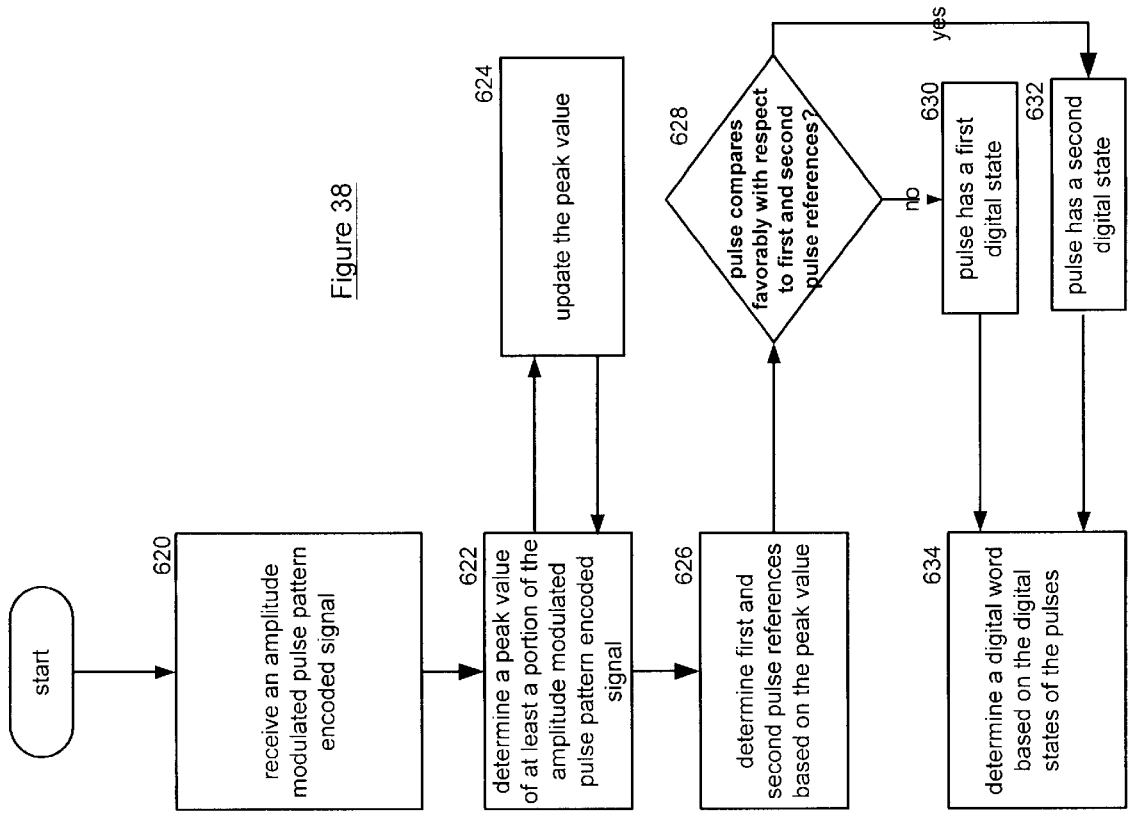
FIG. 38 illustrates a logic diagram of a method for amplitude decoding pulse power encoded signals in accordance with the present invention.

FIG. 38 illustrates a logic diagram of a method for demodulating amplitude modulated pulse pattern encoded signals. The process begins at 620 where an amplitude modulated pulse pattern encoded signal is received. The process then proceeds to step 622 where a peak value is determined for at least a portion of the amplitude modulated pulse pattern encoded signal. At step 624, the peak value is periodically updated.

The process then proceeds to step 626 where first and second pulse references are determined based on the peak value. The process then proceeds to step 628 where a determination is made as to whether the pulse codes favorably with respect to the first and second pulse references. If the pulse compares favorably to the first reference but not the second, the process proceeds to step 630 where the pulse is determined to have a first digital state. It however, the pulse compared favorably to both the first and second states, the process proceeds to step 632 where the pulse is determined to have a second digital state. If no pulse was present, a don't care digital state is obtained. The process then proceeds to step 634 where a digital word is determined based on the digital states of the pulses. The preceding discussion has presented various methods and apparatus for infrared modulation and demodulation techniques. By incorporating the teachings of the present invention, data rates in excess of 11 Mbps may be obtained utilizing commercially grade LEDs and LRDs. As one of average skill in the art would appreciate, embodiments other than the ones described herein may be derived from the teachings of the present invention without deviating from the spirit or scope of the claims.

What is claimed is:

1. A method for pulse position modulation, the method comprising the steps of:

(a) receiving a digital data stream;

(b) obtaining a set of bits from the digital data stream;

(c) modulating the set of bits into a pulse having a first pulse width when the set of bits are in a first range of values and modulating the set of bits into the pulse having a second pulse width when the set of bits are in a second range of values;

(d) based on the set of bits, positioning a transition edge of the pulse at one of a plurality of time intervals within a time chip, wherein the first pulse width and the second pulse width are greater than any one of the plurality of time intervals.

2. The method of claim 1 further comprises:

obtaining a second set of bits from the digital data stream;

modulating the second set of bits into a second pulse; and positioning a transition edge of the second pulse at one of a plurality of time intervals of another time chip.

3. The method of claim 1 further comprises, within step (d), positioning the pulse at at least one of a leading transition edge and a trailing transition edge of one of the plurality of time intervals.

4. The method of claim 1 further comprises modulating an amplitude of the pulse based on the set of bits.

5. The method of claim 1 further comprises, within step (c), modulating the set of bits into the pulse having a third pulse width when the set of bits are in a third range of values.

6. A method for pulse position modulating, the method comprising the steps of:
 a) receiving a digital data stream;
 b) obtaining a set of bits from the digital data stream;
 c) positioning a pulse at one of a plurality of time intervals to represent the set of bits, wherein the pulse has a first pulse width when the set of bits are in a first range of values and the pulse has a second pulse width when the set of bits are in a second range of values.

7. The method of claim 6 further comprises modulating an amplitude of the pulse to further represent the set of bits.

8. The method of claim 6 further comprises, within step (c), generating the pulse to have a third pulse width when the set of bits are in a third range of values.

9. A pulse position modulator comprising:
 a data receiver operably coupled to receive a digital data stream and to provide, at predetermined intervals, a set of bits from the digital data stream;
 a pulse generation circuit operably coupled to generate the pulse to have a first pulse width when the set of bits are in a first range of values and to generate the pulse to have a second pulse width when the set of bits are in a second range of values;
 a pulse positioning circuit operably coupled to the data receiver and pulse generation circuit, wherein, based on the set of bits, the pulse positioning circuit positions the pulse at one of a plurality of time intervals of a time chip, wherein the the first pulse width and the second pulse width are greater than any one of the plurality of time intervals.

10. The pulse position modulator of claim 9, further comprises the pulse generation circuit being operably coupled to generate the pulse to have a third pulse width when the set of bits are in a third range of values.

11. The pulse position modulator of claim 9 further comprises the pulse generation circuit being operably coupled to generate the pulse having a first amplitude when the set of bits are in a first range of values and to generate the pulse having a second amplitude when the set of bits are in a second range of values.

12. The pulse position modulator of claim 9 further comprises a driver operably coupled to the pulse positioning circuit, wherein the driver amplifies the positioned pulse.

13. The pulse position modulator of claim 12, further comprises a light transmitting diode operably coupled to the driver, wherein the light transmitting diode transmits, via an infrared transmission path, the amplified pulse.

14. The pulse position modulator of claim 9 further comprises memory operably coupled to the positioning circuit, wherein the memory stores a look-up table that relates the set of bits to particular ones of the plurality of intervals.

15. A pulse position modulator comprises:
 a processing device; and
 a memory that stores programming instructions that, when read by the processing device, causes the processing device to (a) receive a digital data stream; (b) obtain a set of bits from the digital data stream; (c) modulate the set of bits into the pulse having a first pulse width when the set of bits are in a first range of values and modulate the set of bits into the pulse having a second pulse width when the set of bits are in a second range of values; and (d) based on the set of bits, position a transition edge of the pulse at one of a plurality of time intervals within a time chip, wherein the first pulse width and the second pulse width are greater than any one of the plurality of time intervals.

16. The pulse positioning modulator of claim 15 further comprises, within the memory, programming instructions that, when read by the processing device, causes the processing device to modulate an amplitude of the pulse based on the set of bits.

17. A pulse position modulator comprises:
 a processing device; and
 a memory that stores programming instructions that, when read by the processing device, causes the processing device to (a) receive a digital data stream; (b) obtain a set of bits from the digital data stream; and (c) based on the set of bits, position a transition edge of the pulse at one of a plurality of time intervals within a time chip, wherein the pulse has a first pulse width when the set of bits are in a first range of values and a second pulse width when the set of bits are in a second range of values the first pulse width and the second pulse width being greater than any one of the plurality of time intervals.

18. The pulse positioning modulator of claim 17 further comprises, within the memory, programming instructions that, when read by the processing device, causes the processing device to modulate an amplitude of the pulse to further represent an individual value.

* * * * *